US008735233B2

(12) United States Patent
Oda et al.

(10) Patent No.: US 8,735,233 B2
(45) Date of Patent: May 27, 2014

(54) MANUFACTURING METHOD FOR THIN FILM SEMICONDUCTOR DEVICE, MANUFACTURING METHOD FOR THIN FILM SEMICONDUCTOR ARRAY SUBSTRATE, METHOD OF FORMING CRYSTALLINE SILICON THIN FILM, AND APPARATUS FOR FORMING CRYSTALLINE SILICON THIN FILM

(75) Inventors: Tomohiko Oda, Osaka (JP); Takahiro Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/451,078

(22) Filed: Apr. 19, 2012

(65) Prior Publication Data

US 2012/0309140 A1 Dec. 6, 2012

Related U.S. Application Data

(63) Continuation of application No. PCT/JP2011/003109, filed on Jun. 2, 2011.

(51) Int. Cl.
*H01L 21/00* (2006.01)
*H01L 21/36* (2006.01)

(52) U.S. Cl.
USPC .......... 438/158; 438/166; 438/487; 438/798; 250/492.2; 257/E21.134; 257/E21.414; 257/E21.535

(58) Field of Classification Search
USPC ............... 438/158, 166, 487, 798; 250/492.2; 257/E21.134, E21.414, E21.535
See application file for complete search history.

(56) References Cited

U.S. PATENT DOCUMENTS 4,679,184 A * 7/1987 Yoshida et al. .......... 369/112.09
5,529,951 A 6/1996 Noguchi et al.
5,869,803 A 2/1999 Noguchi et al.
6,071,765 A 6/2000 Noguchi et al.
6,863,733 B1 * 3/2005 Tanabe .......................... 118/722
7,405,114 B2 7/2008 Oishi (Continued)

FOREIGN PATENT DOCUMENTS

JP 07-235490 9/1995
JP 2004-158837 6/2004

(Continued)

OTHER PUBLICATIONS

International Search Report in PCT/JP2011/003109, dated Sep. 6, 2011.

*Primary Examiner* — Charles Garber
*Assistant Examiner* — Ron Pompey
(74) *Attorney, Agent, or Firm* — Greenblum & Bernstein, P.L.C.

(57) ABSTRACT

A crystalline silicon thin film is formed by irradiating a silicon thin film with a laser beam. The laser beam is a continuous wave laser beam. An intensity distribution of the laser beam in a first region about a center of the intensity distribution is symmetric on an anterior side and a posterior side of the center. The intensity distribution in a second region about the center is asymmetric on the anterior side and the posterior side. The first region is from the maximum intensity of the laser beam at the center to an intensity half of the maximum intensity. The second region is at most equal to the half of the maximum intensity of the laser beam. In the second region, an integral intensity value on the posterior side is larger than on the anterior side.

17 Claims, 12 Drawing Sheets

(56) References Cited

U.S. PATENT DOCUMENTS

| | | | | |
|---|---|---|---|---|
| 7,502,107 | B2 * | 3/2009 | Mohanty et al. | 356/317 |
| 7,566,669 | B2 * | 7/2009 | Tanaka et al. | 438/795 |
| 8,284,369 | B2 * | 10/2012 | Chida et al. | 349/149 |
| 2004/0074881 | A1 | 4/2004 | Oishi | |
| 2005/0236622 | A1 | 10/2005 | Jung et al. | |
| 2007/0070283 | A1 * | 3/2007 | Maki et al. | 349/146 |
| 2007/0148834 | A1 * | 6/2007 | Tanaka et al. | 438/151 |
| 2008/0035926 | A1 * | 2/2008 | Toyota et al. | 257/59 |
| 2008/0171410 | A1 * | 7/2008 | Moriwaka et al. | 438/166 |
| 2009/0046757 | A1 * | 2/2009 | Miyairi et al. | 372/101 |
| 2009/0149007 | A1 | 6/2009 | Jung et al. | |
| 2009/0269893 | A1 * | 10/2009 | Hashimoto et al. | 438/264 |
| 2010/0207040 | A1 * | 8/2010 | Tanaka et al. | 250/492.2 |
| 2011/0201183 | A1 * | 8/2011 | Moriwaka et al. | 438/487 |
| 2011/0297950 | A1 | 12/2011 | Kato et al. | |
| 2011/0318891 | A1 | 12/2011 | Oda et al. | |
| 2012/0032179 | A1 | 2/2012 | Saitoh et al. | |
| 2012/0064701 | A1 | 3/2012 | Saito et al. | |

FOREIGN PATENT DOCUMENTS

| | | | |
|---|---|---|---|
| JP | 2004-260144 | * | 9/2004 |
| JP | 2005-303299 | | 10/2005 |
| JP | 2007-221062 | | 8/2007 |
| JP | 2008-091811 | | 4/2008 |
| JP | 2008-305866 | | 12/2008 |
| JP | 2009-065138 | | 3/2009 |
| JP | 2010-153876 | | 7/2010 |

* cited by examiner

MANUFACTURING METHOD FOR THIN FILM SEMICONDUCTOR DEVICE, MANUFACTURING METHOD FOR THIN FILM SEMICONDUCTOR ARRAY SUBSTRATE, METHOD OF FORMING CRYSTALLINE SILICON THIN FILM, AND APPARATUS FOR FORMING CRYSTALLINE SILICON THIN FILM

CROSS REFERENCE TO RELATED APPLICATION

This is a continuation application of PCT Patent Application No. PCT/JP2011/003109, filed on Jun. 2, 2011, designating the United States of America, the disclosure of which, including the specification, drawings and claims, is incorporated herein by reference in its entirety.

BACKGROUND OF THE INVENTION

1. Field of the Invention

The present invention relates to a manufacturing method for thin film semiconductor device, a manufacturing method for a thin film semiconductor array substrate, a method of forming a crystalline silicon thin film, and an apparatus for forming a crystalline silicon thin film.

2. Description of the Related Art

In an active-matrix driven display device such as an organic electro luminescence (EL) display apparatus or a liquid crystal display, thin film semiconductor devices known as thin film transistors (TFT) are used.

In this type of display apparatus, an array of the thin film transistors configures a thin film transistor array device. In each pixel, a thin film transistor for driving the pixel (driving transistor) and a thin film transistor used for selecting the pixel (switching transistor) are formed.

In particular, in the light-emitting organic EL display apparatus having organic EL devices, different capabilities are required for driving transistors and switching transistors. More specifically, good turn-on characteristics are required for the driving transistors in order to improve the driving capability of the organic EL devices, and good turn-off characteristics are required for the switching transistors.

A thin film transistor includes a gate electrode, a semiconductor layer (channel layer), a source electrode, and a drain electrode that are formed on the substrate, and a silicon thin film is generally used as the channel layer. The silicon thin films are roughly classified into non-crystalline silicon thin films (amorphous silicon film) and crystalline silicon thin films.

A thin film transistor with a crystalline silicon thin film as the channel layer has larger carrier mobility and better turn-on characteristics compared to a thin film transistor having the non-crystalline silicon thin film as the channel layer. Accordingly, there is a known technology using the crystalline silicon thin film as the channel layer of the driving transistor, and Patent Literature 1: Japanese Unexamined Patent Application Publication No. H07-235490 discloses a technology for forming the crystalline silicon thin film, for example.

The conventional method of forming the crystalline silicon thin film disclosed in Patent Literature 1, is a method for poly-crystallizing the amorphous silicon film formed on the substrate by setting the amorphous silicon film to a predetermined temperature, and irradiating the amorphous silicon film with laser at a predetermined laser energy density.

SUMMARY OF THE INVENTION

In recent years, demand for displays of faster driving speed and higher definition increases, and further improvement on the turn-on characteristics of thin film transistors have been requested. One way to improve the turn-on characteristics of the thin film transistors is to increase the crystal grain size of the crystalline silicon thin film. In this case, the maximum intensity of the laser beam for crystallizing the amorphous silicon film may be increased.

However, if the maximum intensity of the laser beam is simply increased, this necessitates the laser beam with larger output energy. As a result, there are problems that larger input energy and laser facility for higher output are necessary.

In addition, in the organic EL display apparatus, different characteristics are required for the driving transistors and the switching transistors. Accordingly, there are cases where forming the channel layers with different crystal states in one pixel so as to form two different types of thin film transistors having different characteristics in the same pixel.

In this case, laser irradiation for crystallizing the channel layer using laser beams of different output states for the driving transistor and the switching transistor would cause problems such as variations in characteristics of transistors in different pixels, or making the laser facility more complex.

The present invention has been conceived in view of the problems described above, and it is an object of the present invention to provide a manufacturing method for a thin film semiconductor device, a manufacturing method for a thin film semiconductor array, a method of forming crystalline silicon thin film, and an apparatus for manufacturing crystalline silicon thin film.

In order to achieve the object described above, an aspect of the thin film semiconductor device according to the present invention includes: preparing a substrate; forming a gate electrode above the substrate; forming a gate insulating film above the substrate; forming a source electrode and a drain electrode above the substrate; forming a silicon thin film above the substrate; and forming a crystalline silicon thin film by irradiating the silicon thin film with a laser beam while relatively scanning the silicon thin film with the laser beam in a predetermined relative scanning direction so as to crystallize the silicon thin film; wherein the laser beam is a continuous wave laser beam, an intensity distribution of the laser beam in a first region is symmetric on an anterior side and a posterior side of the relative scanning direction with a maximum intensity as a center, and the intensity distribution of the laser beam in a second region is asymmetric on the anterior side and the posterior side of the relative scanning direction with the maximum intensity as the center, the first region being a region from the maximum intensity of the laser beam to an intensity half of the maximum intensity, and the second region being a region equal to or lower than the maximum intensity of the laser beam, and in the second region, an integral intensity value S2 of the intensity distribution of the laser beam on the posterior side of the relative scanning direction is larger than an integral intensity value S1 of the intensity distribution of the laser beam on the anterior side of the relative scanning direction.

According to the manufacturing method for the thin film semiconductor device according to the present invention, it is possible to increase the crystal grain size of the crystalline silicon thin film without increasing the laser output energy. Thus, it is possible to improve the turn-on characteristics of the thin film semiconductor device without changing the input energy of the laser.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENT

Figure 1:
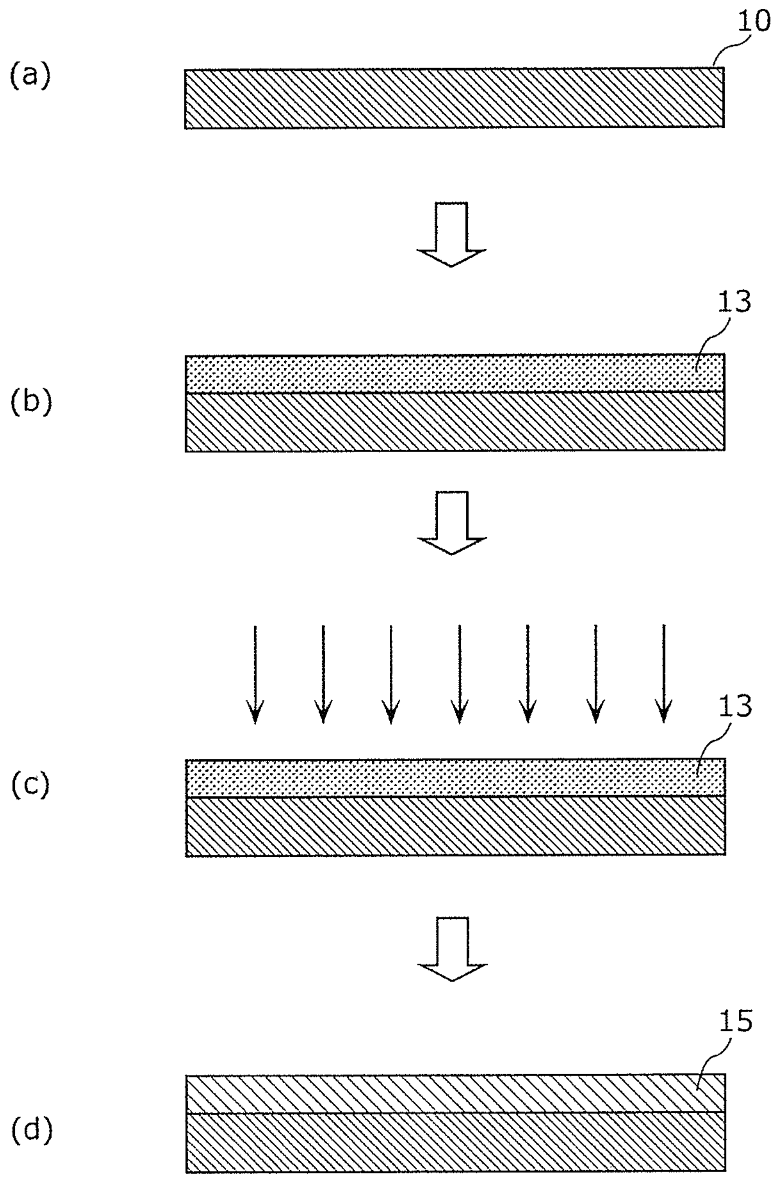
FIG. 1 illustrates cross-sectional views of processes in a method of forming the crystalline silicon thin film according to the embodiment of the present invention.

An aspect of the manufacturing method for the thin film semiconductor device according to the present invention includes: preparing a substrate; forming a gate electrode above the substrate; forming a gate insulating film above the substrate; forming a source electrode and a drain electrode above the substrate; forming a silicon thin film above the substrate; and forming a crystalline silicon thin film by irradiating the silicon thin film with a laser beam while relatively scanning the silicon thin film with the laser beam in a predetermined relative scanning direction so as to crystallize the silicon thin film; wherein the laser beam is a continuous wave laser beam, an intensity distribution of the laser beam in a first region is symmetric on an anterior side and a posterior side of the relative scanning direction with a maximum intensity as a center, and the intensity distribution of the laser beam in a second region is asymmetric on the anterior side and the posterior side of the relative scanning direction with the maximum intensity as the center, the first region being a region from the maximum intensity of the laser beam to an intensity half of the maximum intensity, and the second region being a region equal to or lower than the half of the maximum intensity of the laser beam, and in the second region, an integral intensity value S2 of the intensity distribution of the laser beam on the posterior side of the relative scanning direction is larger than an integral intensity value S1 of the intensity distribution of the laser beam on the anterior side of the relative scanning direction.

With this, it is possible to slow down the cooling speed for the silicon thin film. Thus, it is possible to increase the crystal grain size of the silicon thin film, without increasing the output energy of the laser. Therefore, it is possible to implement the thin film semiconductor device with good turn-on characteristics, without changing the input energy.

Furthermore, in an aspect of the manufacturing method for the thin film semiconductor device according to the present invention, the substrate preparation, the gate electrode formation, the gate insulating film formation, the silicon thin film formation, the crystalline silicon thin film formation, and the source and drain electrodes formation may be performed in this order, in the gate insulating film formation, the gate insulating film may be formed above the gate electrode, in the silicon thin film formation, the silicon thin film may be formed above the gate electrode and on the gate insulating film, and in the source and drain electrodes formation, the source electrode and the drain electrode may be formed above the crystalline silicon thin film.

Alternatively, in an aspect of the manufacturing method for the thin film semiconductor device according to the present invention, the substrate preparation, the silicon thin film formation, the crystalline silicon thin film formation, the gate insulating film formation, the gate electrode formation, and the source and drain electrodes formation may be performed in this order, in the gate insulating film formation, the gate insulating film may be formed above the crystalline silicon thin film, in the gate electrode formation, the gate electrode may be formed above the gate insulating film and in a region above the crystalline silicon thin film between the source electrode and the drain electrode, and in the source and drain electrodes formation, the source electrode and the drain electrode may be formed above the crystalline silicon thin film.

Furthermore, in an aspect of the manufacturing method for the thin film semiconductor device according to the present invention a full width at half maximum (FWHM) of the intensity distribution of the laser beam is preferably between 20 and 50 μm inclusive.

With this, it is possible to form a crystalline silicon thin film without streaks of unevenness, without changing the input energy.

Furthermore, in an aspect of the manufacturing method for the thin film semiconductor device according to the present invention the integral intensity value S1 and the integral intensity value S2 are preferably calculated within a range from 3% to less than 50% of the maximum intensity of the intensity distribution of the laser beam, in the intensity distribution of the laser beam.

With this, it is possible to increase the cooling time when crystallizing the silicon thin film.

Furthermore, in an aspect of the manufacturing method for the thin film semiconductor device according to the present invention, it is preferable that the integral intensity value S1 and the integral intensity value S2 satisfy $S2>1.5\times S1$.

With this, it is possible to extend the cooling time when crystallizing the silicon thin film, increasing the electron mobility of the thin film semiconductor device.

Furthermore, in an aspect of the manufacturing method for the thin film semiconductor device according to the present invention, the intensity distribution of the laser beam may be formed such that the relative scanning direction may be a short-axis direction of the intensity distribution of the laser beam.

Furthermore, in an aspect of the manufacturing method for the thin film semiconductor device according to the present invention the intensity distribution of the laser beam may be flat in a direction orthogonal to the relative scanning direction. Here, a width of a flat part of the intensity distribution of the laser beam is preferably equal to or wider than a width of the silicon thin film in a direction orthogonal to the relative scanning direction.

Furthermore, in an aspect of the manufacturing method for the thin film semiconductor device according to the present invention, the crystalline silicon thin film may include a silicon crystal grain with a crystal grain size between 30 and 300 nm inclusive. the crystalline silicon thin film may be composed of silicon crystal grains each having a crystal grain size between 30 and 300 nm inclusive.

Furthermore, in an aspect of the manufacturing method for the thin film semiconductor array substrate according to the present invention includes preparing a substrate; forming a gate electrode above the substrate; forming a gate insulating film above the substrate; forming a source electrode and a drain electrode above the substrate; forming a silicon thin film above the substrate; and forming a crystalline silicon thin film by irradiating the silicon thin film with a laser beam while relatively scanning the silicon thin film with the laser beam in a predetermined relative scanning direction so as to crystallize the silicon thin film, in which the laser beam is a continuous wave laser beam, an intensity distribution of the laser beam in a first region is symmetric on one side and the other side of the relative scanning direction with a maximum intensity as a center, and the intensity distribution of the laser beam in a second region is asymmetric on the one side and the other side of the relative scanning direction with the maximum intensity as the center, the first region being a region from the maximum intensity of the laser beam to an intensity half of the maximum intensity, and the second region being a region equal to or lower than the half of the maximum intensity of the laser beam, in the second region, an integral intensity value S2 of the intensity distribution of the laser beam on the other side of the relative scanning direction is larger than an integral intensity value S1 of the intensity distribution of the laser beam on the one side of the relative scanning direction, and the relative scanning is performed such that the one side is an anterior side of the relative scanning direction, and that the other side is an anterior side of the relative scanning direction by inverting the intensity distribution of the laser beam.

With this, it is possible to form a crystalline silicon thin film with different crystal states without changing the output waveform of the laser, facilitating formation of the thin film semiconductor devices with different characteristics.

Furthermore, in an aspect of the manufacturing method for the thin film semiconductor device according to the present invention, the substrate preparation, the gate electrode formation, the gate insulating film formation, the silicon thin film formation, the crystalline silicon thin film formation, and the source and drain electrodes formation may be performed in this order, in the gate insulating film formation, the gate insulating film may be formed above the gate electrode, in the silicon thin film formation, the silicon thin film may be formed above the gate electrode and on the gate insulating film, in the source and drain electrodes formation, the source electrode and the drain electrode may be formed above the crystalline silicon thin film.

Alternatively, in an aspect of the manufacturing method for the thin film semiconductor array substrate according to the present invention, the substrate preparation, the silicon thin film formation, the crystalline silicon thin film formation, the gate insulating film formation, the gate electrode formation, and the source and drain electrodes formation may be performed in this order, in the gate insulating film formation, the gate insulating film may be formed above the crystalline silicon thin film, in the gate electrode formation, the gate electrode may be formed above the gate insulating film and in a region above the crystalline silicon thin film between the source electrode and the drain electrode, and in the source and drain electrodes formation, the source electrode and the drain electrode may be formed above the crystalline silicon thin film.

Furthermore, in an aspect of the manufacturing method for the thin film semiconductor array substrate according to the present invention, a full width at half maximum (FWHM) of the intensity distribution of the laser beam is preferably between 20 to 50 μm inclusive.

With this, it is possible to form a crystalline silicon thin film without streaks of unevenness, without changing the input energy.

Furthermore, in an aspect of the manufacturing method for the thin film semiconductor array substrate according to the present invention, the integral intensity value S1 and the integral intensity value S2 preferably satisfy $S2>1.5\times S1$.

With this, it is possible to increase the cooling time when crystallizing the silicon thin film.

Furthermore, an aspect of the method of forming the crystalline silicon thin film according to the present invention includes: preparing a substrate; forming a silicon thin film above the substrate; and forming a crystalline silicon thin film by irradiating the silicon thin film with a laser beam while relatively scanning the silicon thin film with the laser beam in a predetermined relative scanning direction so as to crystallize the silicon thin film, in which the laser beam is a continuous wave laser beam, an intensity distribution of the laser beam in a first region is symmetric on an anterior side and a posterior side of the relative scanning direction with a maximum intensity as a center, and the intensity distribution of the laser beam in a second region is asymmetric on the anterior side and the posterior side of the relative scanning direction with the maximum intensity as the center, the first region being a region from the maximum intensity of the laser beam to an intensity half of the maximum intensity, and the second region being a region equal to or lower than the half of the maximum intensity of the laser beam, and in the second region, an integral intensity value S2 of the intensity distribution of the laser beam on the posterior side of the relative scanning direction is larger than an integral intensity value S1 of the intensity distribution of the laser beam on the anterior side of the relative scanning direction.

With this, it is possible to slow down the cooling speed of the silicon thin film. Thus, it is possible to increase the crystal grain size of the silicon thin film, without increasing the output energy of the laser. Accordingly, the crystalline silicon thin film with a large crystal grain size can be formed without changing the input energy.

Furthermore, an aspect of the apparatus for forming the crystalline silicon thin film according to the present invention includes: a substrate holding unit which holds a substrate on which a silicon thin film is formed; a laser beam oscillating unit which oscillates a laser beam for crystallizing the silicon thin film; an optical system unit for irradiating a predetermined region of the silicon thin film with a laser beam oscillated from the laser beam oscillating unit; a scanning control unit for controlling the substrate holding unit and the optical system unit such that the silicon thin film is relatively scanned with the laser beam irradiated on the silicon thin film in a predetermined relative scanning direction; and a laser beam intensity distribution adjusting unit which shapes the laser beam such that an intensity distribution of the laser beam in a first region is symmetric on an anterior side and a posterior side of the relative scanning direction with a maximum intensity as a center, and the intensity distribution of the laser beam in a second region is asymmetric on the anterior side and the posterior side of the relative scanning direction with the maximum intensity as the center, the first region being a region from the maximum intensity of the laser beam to an intensity half of the maximum intensity, and the second region being a region equal to or lower than the half of the maximum intensity of the laser beam, and in the second region, an integral intensity value S2 of the intensity distribution of the laser beam on the posterior side of the relative scanning direction is larger than an integral intensity value S1 of the intensity distribution of the laser beam on the anterior side of the relative scanning direction.

With this, it is possible to form the crystalline silicon thin film having a large crystal grain size, without increasing the laser output energy.

Furthermore, in an aspect of the apparatus for forming the crystalline silicon thin film according to the present invention, a full width at half maximum (FWHM) of the intensity distribution of the laser beam is preferably between 20 to 50 μm inclusive.

With this, it is possible to form a crystalline silicon thin film without streaks of unevenness, without changing the input energy.

Furthermore, in an aspect of the apparatus for forming the crystalline silicon thin film according to the present invention, the integral intensity value S1 and the integral intensity value S2 preferably satisfy $S2>1.5\times S1$.

With this, it is possible to increase the cooling time when crystallizing the silicon thin film.

Furthermore, an aspect of the apparatus for forming the crystalline silicon thin film according to the present invention may further include a laser beam inverting mechanism for inverting the intensity distribution of the laser beam such that the integral intensity value S2 is the anterior side of the relative scanning direction, and the integral intensity value S1 is the posterior side of the relative scanning direction. In this case, the optical system unit may include the laser beam inverting mechanism, and the optical system unit may invert the intensity distribution of the laser beam by outputting the laser beam in a non-inverted output or an inverted output. Alternatively, the substrate holding unit may include the laser beam inverting mechanism, and the substrate holding unit may invert the intensity distribution of the laser beam by rotating the substrate holding unit.

Embodiment

The following shall describe a manufacturing method for a thin film semiconductor device, a manufacturing method for a thin film semiconductor array substrate, a method of forming a crystalline silicon thin film, and an apparatus for forming the crystalline silicon thin film according to the present invention, with reference to the drawings.

(Method of Forming Crystalline Silicon Thin Film)

Figure 2A:
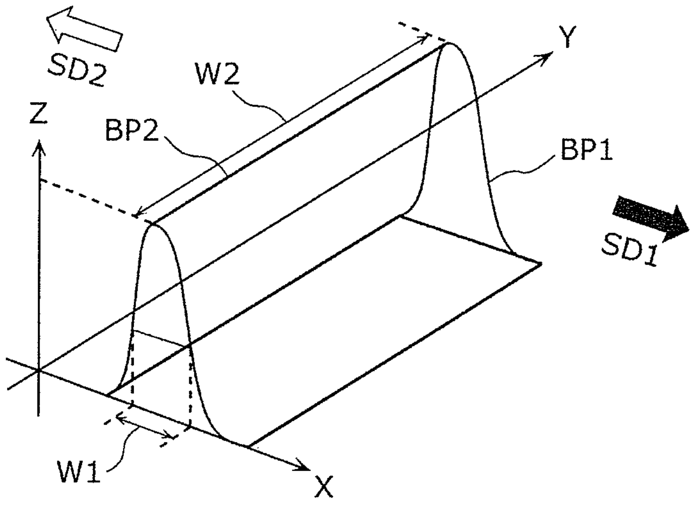
FIG. 2A illustrates an intensity distribution (beam profile) of CW laser beam used for the silicon thin film crystallizing process in the method of forming the crystalline silicon thin film according to the present invention.
Figure 2B:
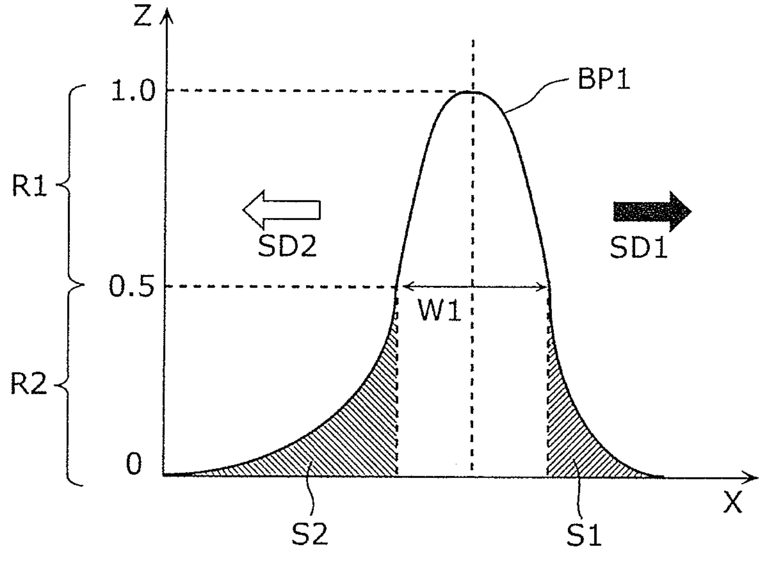
FIG. 2B illustrates the intensity distribution of the CW laser beam in FIG. 2A in the short-axis direction.

First, a method of forming a crystalline silicon thin film according to the embodiment of the present invention shall be described with reference to FIGS. 1, 2A, and 2B. FIG. 1 includes cross-sectional views of processes in the method of forming the crystalline silicon thin film according to the embodiment of the present invention. FIG. 2A illustrates an intensity distribution (beam profile) of CW laser beam used in a silicon thin film crystallizing process in the method of forming the crystalline silicon thin film according to the present invention. FIG. 2B illustrates an intensity distribution in the short-axis direction of the CW laser in FIG. 2A. Note that, in FIG. 2B, the intensity of the laser beam is normalized with the maximum intensity of the laser beam as 1.0.

The following shall sequentially describe each process in the method of forming the crystalline silicon thin film according to the embodiment. As illustrated in FIG. 1 (*a*), a substrate 10 is prepared (substrate preparation process). Next, as illustrated in FIG. 1 (*b*), a non-crystalline silicon thin film 13 composed of an amorphous silicon film, for example, is formed above the substrate 10 (silicon thin film forming process). Next, as illustrated in FIG. 1 (*c*), the silicon thin film 13 is irradiated with a laser beam, thereby crystallizing the silicon thin film 13 to form a crystalline silicon thin film 15, as illustrated in FIG. 1 (*d*) (silicon thin film crystallizing process).

When irradiating the silicon thin film with the laser beam, the irradiation is performed along with a predetermined relative scanning direction with respect to the silicon thin film 13, so as to perform relative scanning. In addition, the laser used in the embodiment is a continuous wave laser (CW laser). Unlike the pulse laser, the laser beam of the CW laser is continuously oscillated.

More specifically, the laser beam according to the embodiment has an intensity distribution BP1 in the short-axis (x axis) direction, and an light intensity distribution BP2 in the long axis (y axis) direction perpendicular to the short-axis direction. The intensity distribution BP1 is a convex-shaped Gaussian distribution, and the light intensity distribution BP2 is a top-flat distribution as illustrated in FIG. 2A.

As illustrated in FIG. 2B, the intensity distribution BP1 of the laser beam in the short-axis direction has the following characteristics. In the first region R1 from the maximum intensity of the laser beam (Z=1.0) to the intensity ½ of the maximum intensity (Z=0.5), the intensity distribution is symmetric on the one side and the other side in the short-axis direction with the maximum intensity as the center. In the second region R2 in which the intensity of the laser beam is ½ or less of the maximum intensity, the intensity distribution is asymmetric with respect to the one side and the other side in the short-axis direction.

Furthermore, as illustrated in FIG. 2B, the intensity distribution of the laser beam in the short-axis direction is shaped as follows. In the second region R2 in which the light intensity distribution is asymmetrical, the integral intensity value S2 of the intensity distribution of the laser beam on the other side with the maximum intensity as the center (the area indicated by the right-downward diagonal hatching) is formed to be larger than the integral intensity value S1 of the intensity distribution of the laser beam on one side with the maximum intensity as the center (the area indicated by the right-upward diagonal hatching). In other words, the relationship between the integral intensity value S2 and the integral intensity value S1 is S2>S1.

Note that, in FIGS. 2A and 2B, W1 represents a full width at half maximum (FWHM) of the intensity distribution BP1 in the short-axis direction of the laser beam. In FIG. 2A, W2 represents a long axis-wise width of the intensity distribution BP2 in the long-axis direction of the laser beam (flat width).

The laser beam with the configuration described above is used for a relative scanning on the non-crystalline silicon thin film with the short-axis direction of the intensity distribution of the laser beam as a scanning direction (SD1 or SD2), when irradiating the non-crystalline silicon thin film with the laser beam. More specifically, the silicon thin film is relatively scanned with the laser beam by moving at least of the laser beam and the silicon thin film. Subsequently, the non-crystalline silicon thin film irradiated with the laser beam is annealed by the thermal energy of the laser beam, forming crystals and changing to the crystalline silicon thin film. Note that, since the laser used in the embodiment is a CW laser, the non-crystalline silicon thin film to be crystallized is continuously irradiated with the laser beam.

Furthermore, in the embodiment, among the scanning direction SD1 and the scanning direction SD2, the non-crystalline silicon thin film is irradiated with the laser beam with the scanning direction SD1 on the anterior side (heat input side) and with the scanning direction SD2 on the posterior side (cooling side). More specifically, the relative scanning of the laser beam is performed with the light intensity distribution forming the integral intensity value S1 on the anterior side of the relative scanning direction, and with the light intensity distribution forming the integral intensity value S2 on the posterior side of the relative scanning direction. Note that, in FIGS. 2A and 2B, the scanning direction SD1 and the scanning direction SD2 represent scanning directions that are opposite to each other.

As described above, according to the method of forming the crystalline silicon thin film according to the embodiment, the intensity distribution of the CW laser beam when crystallizing the silicon thin film is configured such that the integral intensity value S2 in the posterior side of the beam scanning direction (cooling side) is larger than the anterior side of the beam scanning direction (heat input side). More specifically, the intensity distribution of the laser beam in the embodiment is asymmetric on the heat input side and the cooling side, and has an expanded bottom on the cooling side.

With this, compared to the laser irradiation using a laser beam with the same maximum intensity and the FWHM, and with an intensity distribution symmetric with respect to the heat input side and the cooling side, it is possible to slow down the cooling speed of the silicon thin film. Thus, it is possible to substantially increase the heat-input time for the silicon thin film, increasing the crystal grain size of the silicon thin film without increasing the laser output energy. Accordingly, the crystalline silicon thin film with a large crystal grain size can be formed without changing the input energy determined by the FWHM.

Figure 3:
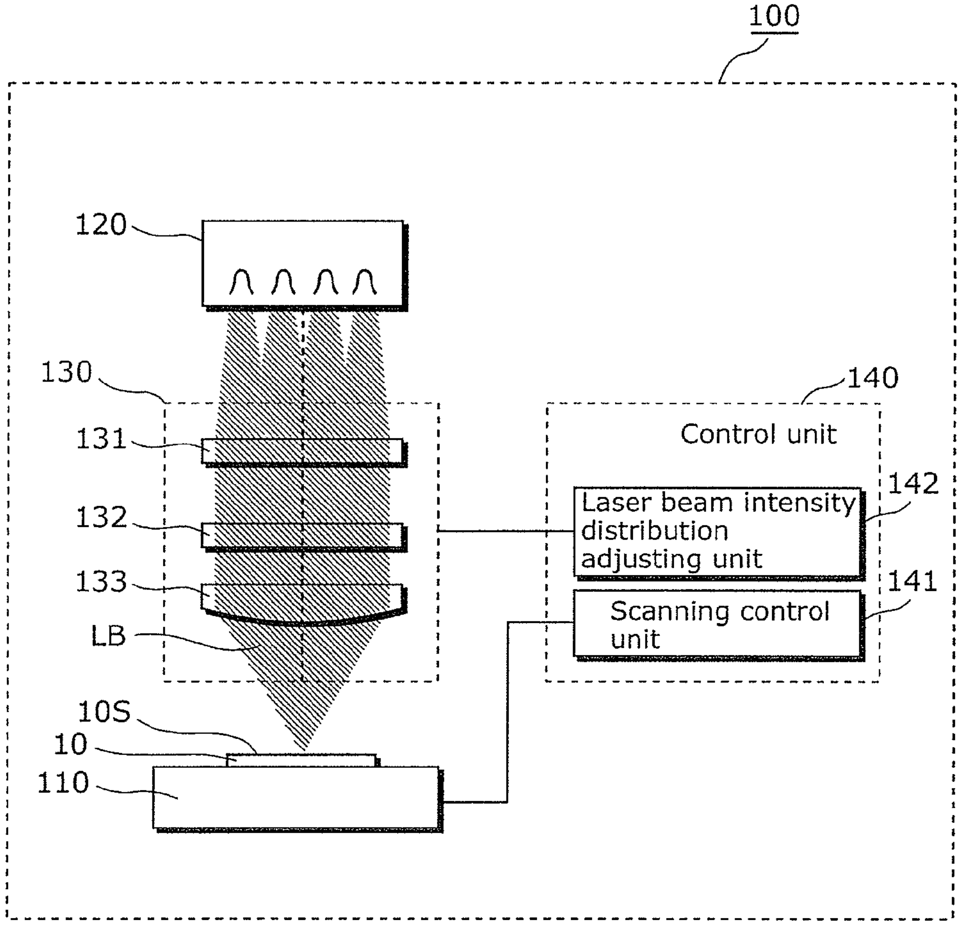
FIG. 3 illustrates the configuration of the crystalline silicon thin film forming device according to the embodiment of the present invention.

Next, a crystalline silicon thin film forming apparatus 100 for shaping a laser beam with the light intensity distribution illustrated in FIGS. 2A and 2B and for crystallizing the silicon thin film shall be described with reference to FIG. 3. FIG. 3 illustrates the configuration of the crystalline silicon thin film forming apparatus according to the embodiment of the present invention.

As illustrated in FIG. 3, the crystalline silicon thin film forming apparatus 100 according to the embodiment is an apparatus using the CW laser beam for crystallizing the silicon thin film, and includes a substrate holding unit 110, a laser beam oscillating unit 120, a optical system unit 130, and a control unit 140 including a scanning control unit 141 and the laser beam intensity distribution adjusting unit 142.

The substrate holding unit 110 is a stage for holding a substrate 10 on which a non-crystalline silicon thin film to be crystallized is formed. On a surface 10S of the substrate 10 which is irradiated with the laser beam LB, an amorphous silicon film is formed as the non-crystalline silicon thin film, for example.

The laser beam oscillating unit 120 is an optical source for oscillating the laser beam LB for crystallizing the silicon thin film. Four semiconductor laser devices are provided in the laser beam oscillating unit 120, and each of the semiconductor laser devices oscillates a laser beam having single-peaked bilaterally symmetric light intensity distribution. As the semiconductor laser device, a blue laser beam or a green laser beam with a wavelength range between 405 nm and 632 nm is continuously oscillated in the micro second order of 10 to 100 μsecs, for example.

The optical system unit 130 includes beam-shaping lenses, and is configured to shape the laser beam LB oscillated by the laser beam oscillating unit 120 into a predetermined intensity distribution, and to irradiate a predetermined region of the silicon thin film with the laser beam LB. In this embodiment, the optical system unit 130 is configured of a homogenizer 131, a condenser lens 132, and a diffractive optical element (DOE) lens 133. Note that, as the beam shaping lens, a lens for shaping a beam profile in the long-axis direction and a lens for shaping a beam profile in the short-axis direction may be separately provided.

In the control unit 140, the scanning control unit 141 controls the substrate holding unit 110 or the optical system 130 such that the silicon thin film is relatively scanned with the laser beam LB. The scanning control unit 141 in the embodiment controls the substrate holding unit 110 such that the substrate holding unit 110 moves to a predetermined position, as illustrated in FIG. 3.

In addition, the laser beam intensity distribution adjusting unit 142 shapes the laser beam LB to have the predetermined intensity distribution. The laser beam intensity distribution adjusting unit 142 according to the embodiment shapes the laser beam LB oscillated by the laser beam oscillating unit 120 by adjusting the lenses configuring the optical system unit 130, and by shaping the laser beam LB to have the light intensity distribution illustrated in FIGS. 2A and 2B.

Note that, the crystalline silicon thin film forming apparatus 100 may further include optical parts such as a mirror and a light-condensing lens, or may also include a beam profiler for measuring the beam profile of the laser beam. Measuring the beam profile by the beam profiler allows adjusting the position of the lenses in the optical system 130 by the laser beam intensity distribution adjusting unit 142 such that the laser beam used for irradiation on the silicon thin film has the desired light intensity distribution, for example.

(Manufacturing Method for Thin Film Semiconductor Device)

Next, the manufacturing method for the thin film semiconductor device according to the embodiment of the present invention shall be described. The manufacturing method for the thin film semiconductor device according to the embodiment of the present invention includes a process for preparing the substrate (substrate preparation process), a process for forming the gate electrode above the substrate (gate electrode forming process), a process for forming the gate insulating film above the substrate (gate insulating film forming process), a process for forming the source electrode and the drain electrode above the substrate (source/drain electrode forming process), a process for forming a silicon thin film above the substrate (silicon thin film forming process), and a process for forming a crystalline silicon thin film by irradiating the laser beam so as to crystallize the silicon thin film formed above the substrate (silicon thin film crystallizing process).

The silicon thin film crystallizing process may be performed in the method similar to the silicon thin film crystallizing process in the method of forming the crystalline silicon film described above. Note that, the crystalline silicon thin film obtained by the silicon thin film crystallizing process becomes the channel layer of the thin film semiconductor device.

The thin film semiconductor device has two types of structures, i.e., the bottom-gate type and the top-gate type. The bottom-gate thin film semiconductor device is layered, from the bottom, the gate electrode, the gate insulating film, and the channel layer (silicon semiconductor film). On the other hand, the top-gate thin film semiconductor device is layered, from the bottom, the channel layer, the gate insulating film, and the gate electrode. The following shall specifically describe the manufacturing method for the bottom-gate and top-gate thin film semiconductor devices with reference to the drawings.

(Manufacturing Method for Bottom-Gate Thin Film Semiconductor Device)

Figure 4:
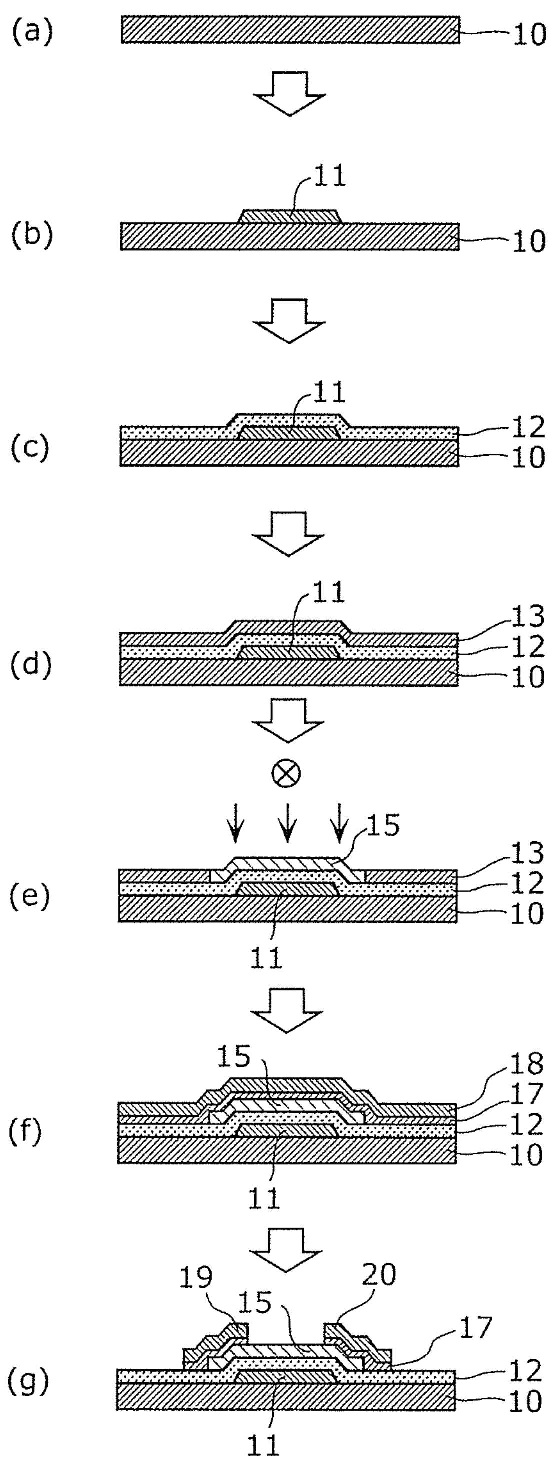
FIG. 4 is cross-sectional views of processes in the method of manufacturing the bottom-gate thin film semiconductor device according to the embodiment of the present invention.

First, the manufacturing method for the bottom-gate thin film semiconductor device according to the embodiment shall be described with reference to FIG. 4. FIG. 4 illustrates cross-sectional views of processes in the manufacturing method for the bottom-gate thin film semiconductor device according to the embodiment of the present invention.

As illustrated in FIG. 4 (*a*), first, a substrate 10 is prepared (substrate preparation process). A glass substrate may be used as the substrate 10, for example. Note that, an undercoating film composed of an insulating film such as a silicon oxide film or a silicon nitride film may be subsequently formed on the substrate 10.

Next, as illustrated in FIG. 4 (*b*), the gate electrode 11 is formed above the substrate 10 by patterning (gate electrode forming process). For example, a gate metal film such as molybdenum-tungsten (MoW) is formed by sputtering on an entire surface above the substrate 10, and photolithography and wet etching are performed on the gate metal film so as to pattern the gate electrode 11 in the predetermined shape.

Next, as illustrated in FIG. 4 (*c*), the gate insulating film 12 is formed above the substrate 10 (gate insulating film forming process). For example, the gate insulating film 12 made of an insulating film such as silicon dioxide is formed on the entire surface above the substrate 10 covering the gate electrode 11 by plasma CVD, for example.

Next, as illustrated in FIG. 4 (*d*), the non-crystalline silicon thin film 13 is formed above the substrate 10 (silicon thin film forming process). For example, on the gate insulating film 12, an amorphous silicon film (amorphous silicon thin film) is formed as the non-crystalline silicon thin film 13 by plasma CVD, for example.

Next, as illustrated in FIG. 4 (*e*), the crystalline silicon thin film 15 is formed by irradiating the predetermined region of the silicon thin film 13 with the laser beam while relatively scanning the silicon thin film 13 with the laser beam so as to crystallize the silicon thin film 13 (silicon thin film crystallizing process). This process is performed in a method similar to the silicon thin film crystallizing process in the method of forming the crystalline silicon thin film described above.

More specifically, the silicon thin film 13 is irradiated with the CW laser beam having the light intensity distribution illustrated in FIGS. 2A and 2B in a microsecond order. Furthermore, the irradiation with the laser beam is performed such that the laser scanning is performed toward the depth direction of the sheet of FIG. 4. More specifically, among the scanning direction SD1 and the scanning direction SD2 illustrated in FIGS. 2A and 2B, the irradiation is performed with the scanning direction SD1 on the anterior side (heat input side) and with the scanning direction SD2 on the posterior side (cooling side). To put it differently, the relative scanning of the laser beam is performed with the relative scanning direction on the short-axis direction of the intensity distribution of the laser beam, the light intensity distribution composing the integral intensity value S1 being the anterior side of the relative scanning direction, and the light intensity distribution composing the integral intensity value S2 being the posterior side of the relative scanning direction. With this, the silicon thin film irradiated with the laser beam is heated and crystallized, turning to the crystalline silicon thin film 15.

Subsequently, although not illustrated, the crystalline silicon thin film 15 is patterned into an island shape by performing photolithography and wet etching so as to selectively pattern the non-crystalline silicon thin film 13 and the crystalline silicon thin film 15.

Next, as illustrated in FIG. 4 (*f*), the amorphous silicon film is formed by plasma CVD, for example, and impurity such as phosphorous is doped on the amorphous silicon film to form an impurity doped $n^+$ layer as the contact layer 17. Subsequently, as illustrated in FIG. 4 (*f*), three-layered source/drain metal film 18 made of MoW/Al/MoW, for example, is formed by sputtering on the contact layer 17.

Next, as illustrated in FIG. 4 (*g*), the source electrode 19 and the drain electrode 20 are formed above the substrate 10 (source/drain electrode forming process). For example, by photolithography and wet etching for patterning the source/drain metal film 18, an opposing pair of source electrode 19 and drain electrode 20 are formed.

Subsequently, by performing dry etching with the resist for patterning the source/drain metal film 18 remaining, the contact layer 17 is separated, and a pair of opposing contact layers 17 is formed. With this, as illustrated in FIG. 4 (*g*), the bottom-gate thin film semiconductor device is manufactured.

As described above, according to the manufacturing method for the bottom-gate thin film semiconductor device according to the embodiment, the intensity distribution of the CW laser beam for crystallizing the silicon thin film to be the channel layer is configured such that the integral intensity value S2 of the light intensity distribution in the posterior side (cooling side) of the beam scanning direction is larger than the integral intensity value S1 of the light intensity distribution in the anterior side (heat input side) of the beam scanning direction. More specifically, the intensity distribution of the laser beam in the embodiment is asymmetric on the heat input side and the cooling side, and has an expanded bottom on the cooling side.

With this, compared to the laser irradiation using a laser beam with the same maximum intensity and the same FWHM, and with an intensity distribution symmetric with respect to the heat input side and the cooling side, it is possible to slow down the cooling speed of the silicon thin film. Thus, it is possible to increase the crystal grain size of the silicon thin film without increasing the laser output energy. Accordingly, without changing the input energy, it is possible to form a channel layer composed of the crystalline silicon thin film with a large crystal grain size, allowing manufacturing a thin film semiconductor device with good turn-on characteristics.

Furthermore, in the manufacturing method for the semiconductor thin film device according to the embodiment, the laser beam with the intensity distribution illustrated in FIGS. 2A and 2B is used. It is preferable that the FWHM W1 of the intensity distribution BP1 of the laser beam in the short-axis direction is between 20 and 50 μm. This point shall be described with reference to FIGS. 5A and 5B.

Figure 5A:
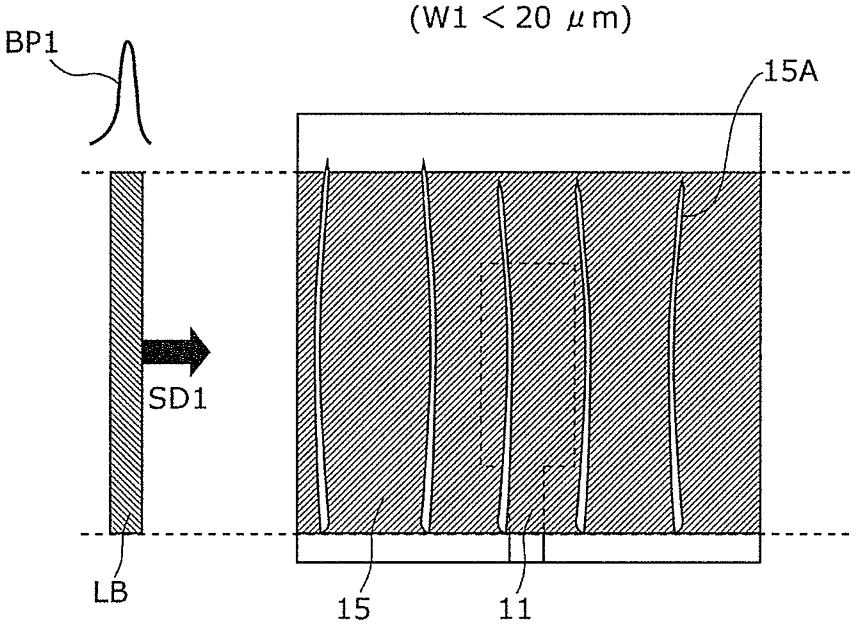
FIG. 5A illustrates a condition of the surface of the crystalline silicon thin film when crystallized using a laser beam having an intensity distribution BP1 with a full width at half maximum (FWHM) W1 smaller than 20 μm in the manufacturing method for a bottom-gate semiconductor thin film device.
Figure 5B:
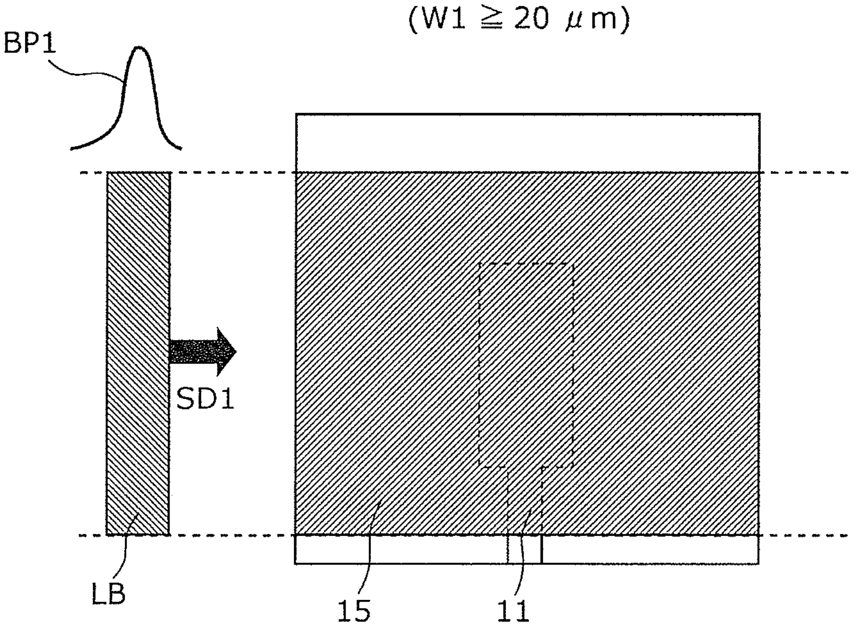
FIG. 5B illustrates a condition of the surface of the crystalline silicon thin film when crystallized using a laser beam having an intensity distribution BP1 with an FWHM of 20 μm or greater in the manufacturing method for a bottom-gate semiconductor thin film device.

Here, FIG. 5A illustrates a condition of the surface of the crystalline silicon thin film when the crystalline silicon thin film is crystallized by the laser beam with the intensity distribution BP1 with the FWHM W1 smaller than 20 μm in the manufacturing method for the bottom-gate semiconductor thin film device. FIG. 5B illustrates a condition of the surface of the crystalline silicon thin film when crystallized by the laser beam with the intensity distribution BP1 with the FWHM equal to or wider than 20 μm. Note that, with regard to FIGS. 5A and 5B, the laser irradiation is performed with the scanning direction SD1 illustrated in FIGS. 2A and 2B as the scanning direction such that the heat input side is the integral intensity value S1 and the cooling side is the integral intensity value S2.

As illustrated in FIG. 5A, when the crystallization is performed using the laser beam with the intensity distribution BP1 having the FWHM W1 smaller than 20 μm, streaks of unevenness 15A extending in a direction orthogonal to the scanning direction appear on the surface of the crystalline silicon thin film 15. In contrast, as illustrated in FIG. 5B, when the silicon thin film is crystallized using the laser beam with the intensity distribution BP1 having the FWHM equal to or wider than 20 μm, it is possible to form the crystalline silicon thin film with a good surface condition, without the streaks of unevenness described above on the surface of the crystalline silicon thin film 15.

In addition, the FWHM of the intensity distribution BP1 of the laser beam exceeds 50 μm results in a decrease in the energy efficiency of the laser beam.

Accordingly, it is preferable that the FWHM W1 of the intensity distribution BP1 of the laser beam in the short-axis direction is between 20 and 50 μm.

Furthermore, in the silicon thin film crystallizing process according to the embodiment, the flat width in the intensity distribution BP2 of the laser beam in the Y axis direction is preferably equal to or wider than the width of the silicon thin film 13 in a portion to be the channel layer in the silicon thin film 13 (the width in which the silicon thin film is formed in a direction orthogonal to the relative scanning direction).

In addition, the crystalline silicon thin film formed in the silicon thin film crystallizing process includes silicon crystal grains with the crystal grain size between 30 and 300 nm.

When the temperature of the silicon thin film at the time of crystallization is within a temperature range lower than the melting point of the amorphous silicon film referred to as the solid phase crystallization (SPC) (between 600° C. and 1100° C.), the silicon thin film is crystallized by the solid phase growth, changing to the crystalline silicon thin film with a crystal structure having an average crystal grain size approximately between 25 nm and 35 nm.

Alternatively, when the temperature of the silicon thin film at the time of crystallization is a temperature range equal to or higher than the melting point of the amorphous silicon and equal to or less then the melting point of silicon referred to as explosive nucleation (Ex) (between 1100° C. and 1414° C.), the silicon thin film is crystallized after going through super-cooled liquid state, changing to the crystalline silicon thin film with crystal structure having an average crystal grain size between 40 nm and 60 nm.

Alternatively, when the temperature of the silicon thin film at the time of crystallization is within a temperature range equal to or higher than the melting point of silicon referred to as the molten range (1414° C. or higher), the silicon thin film is crystallized after being melt and cooled, changing to the crystalline silicon thin film composed of polysilicon having the crystal structure with an average grain size between 60 nm and 1 μm.

With the silicon thin film crystallizing process according to the embodiment, it is possible to form the crystalline silicon thin film at least with silicon crystal grains with the crystal grain size between 30 and 300 nm. Furthermore, according to the embodiment, it is possible to form the mixed crystal crystalline silicon thin film including silicon crystal grains having a crystal grain size between 30 and 300 nm, or to form the crystalline silicon thin film with all of the silicon crystal grains having the crystal grain size between 30 and 300 nm.

(Manufacturing Method for Top-Gate Thin Film Semiconductor Device)

Figure 6:
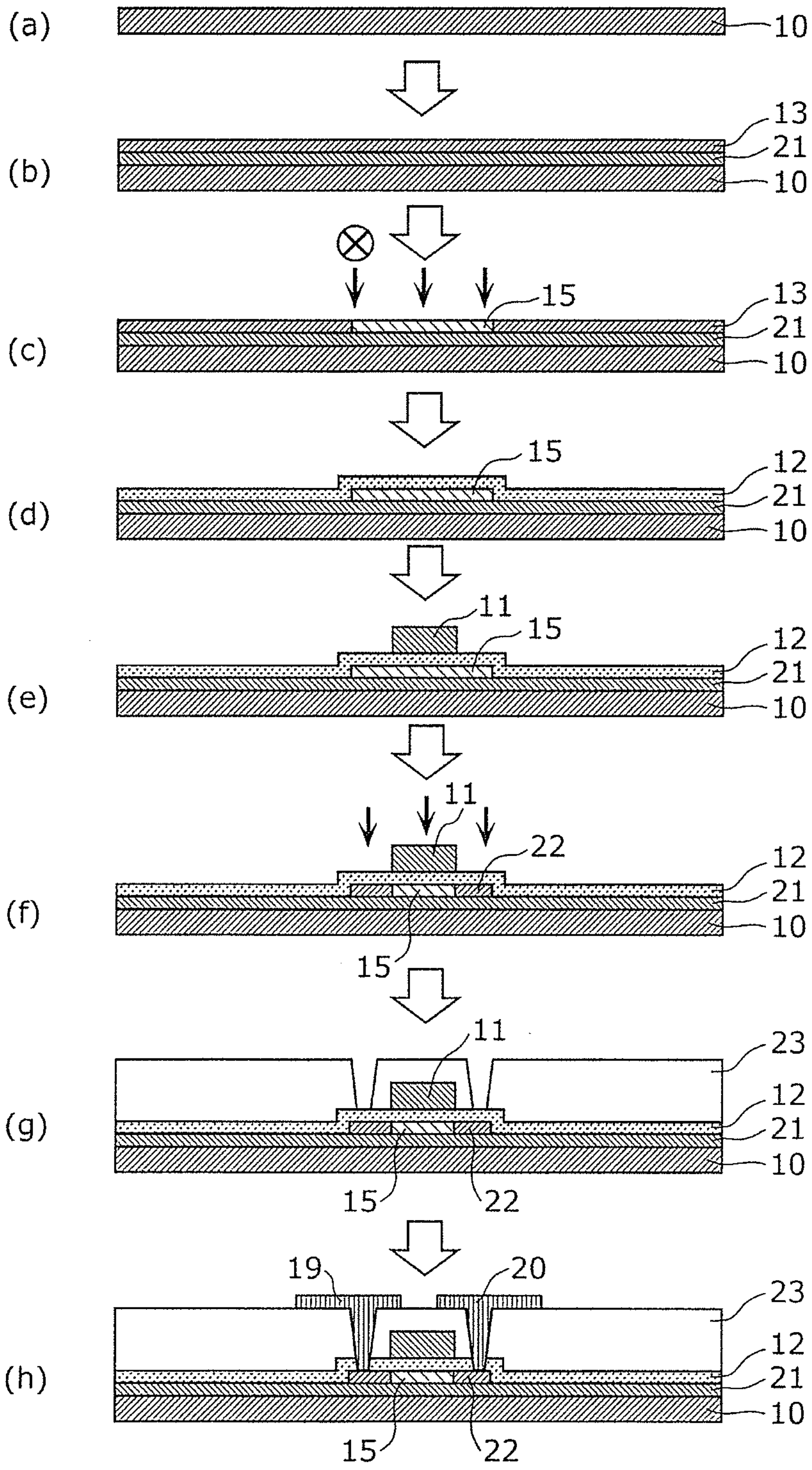
FIG. 6 illustrates cross-sectional views of the processes in the method of manufacturing a top-gate thin film semiconductor device according to the embodiment of the present invention.

Next, the manufacturing method for the top-gate thin film semiconductor device according to the embodiment of the present invention shall be described with reference to FIG. 6. FIG. 6 includes cross-sectional views illustrating processes of the manufacturing method for the top-gate thin film semiconductor device according to the embodiment of the present invention.

As illustrated in FIG. 6 (*a*), a substrate 10 is prepared (substrate preparation process). A glass substrate may be used as the substrate 10, for example.

Next, as illustrated in FIG. 6 (*b*), the undercoating film 21 made of a silicon oxide film or a silicon nitride film is formed on the substrate 10. Subsequently, as illustrated in the diagram, the non-crystalline silicon thin film 13 is formed above the substrate 10 (silicon thin film forming process). For example, on the undercoating film 21, the amorphous silicon film is formed by plasma CVD, for example, as the non-crystalline silicon thin film 13.

Next, as illustrated in FIG. 6 (*c*), the crystalline silicon thin film 15 is formed by irradiating the predetermined region of the silicon thin film 13 with the laser beam while relatively scanning the silicon thin film 13 with the laser beam so as to crystallize the silicon thin film 13 (silicon thin film crystallizing process). This process is performed in the same manner as the silicon thin film crystallizing process in the method of forming the crystalline silicon thin film, that is, in the same manner as the silicon thin film crystallizing process in the manufacturing method for the bottom-gate thin film semiconductor device as illustrated in FIG. 4 (*e*).

More specifically, the silicon thin film 13 is irradiated with the CW laser beam with the light intensity distribution illustrated in FIGS. 2A and 2B in a microsecond order. Furthermore, the irradiation with the laser beam is performed such that the laser scanning is performed toward the depth direction of the sheet of FIG. 6. More specifically, among the scanning direction SD1 and the scanning direction SD2 illustrated in FIGS. 2A and 2B, the irradiation is performed with the scanning direction SD1 on the anterior side (heat input side) and with the scanning direction SD2 on the posterior side (cooling side). To put it differently, the relative scanning of the laser beam is performed with the relative scanning direction on the short-axis direction of the intensity distribution of the laser beam, the light intensity distribution composing the integral intensity value S1 being the anterior side of the relative scanning direction, and the light intensity distribution composing the integral intensity value S2 being the posterior side of the relative scanning direction. With this, the silicon thin film which is irradiated with the laser beam is heated and crystallized, turning to the crystalline silicon thin film 15.

Next, as illustrated in FIG. 6 (*d*), the photolithography and wet etching are performed so as to selectively pattern the non-crystalline silicon thin film 13 and the crystalline silicon thin film 15 and to pattern the crystalline silicon thin film 15 into an island shape.

Subsequently, as illustrated in FIG. 6 (*d*), the gate insulating film 12 is formed above the substrate 10 (gate insulating film forming process). For example, the gate insulating film 12 made of an insulating film such as silicon dioxide is formed on the entire surface above the substrate 10 covering the gate electrode 15 by plasma CVD, for example.

Next, as illustrated in FIG. 6 (*e*), the gate electrode 11 is formed above the substrate 10 by patterning (gate electrode forming process). For example, the gate metal film such as molybdenum-tungsten (MoW) is formed by sputtering on the entire surface above the substrate 10, and the gate metal film is patterned by performing photolithography and wet etching, and thus the gate electrode 11 of the predetermined shape is formed above the crystalline silicon thin film 15 via the gate insulating film 12.

Next, as illustrated in FIG. 6 (*f*), the lightly doped drain (LDD) region 22 is formed by lightly doping impurity at the ends of the crystalline silicon thin film 15 using the gate electrode 11 as a mask.

Next, as illustrated in FIG. 6 (*g*), the passivation film 23 is formed above the substrate 10. For example, the passivation film 23 composed of an insulating film such as silicon dioxide is formed on the entire surface above the substrate 10 by plasma CVD, for example, covering the gate electrode 11 and the gate insulating film 12. After that, as illustrated in FIG. 6 (*g*), contact holes are formed on the passivation film 23, exposing the LDD region 22.

Next, as illustrated in FIG. 6 (*h*), a pair of source electrode 19 and drain electrode 20 is formed on the passivation film 23, filling the contact holes in the passivation film 23. With this, it is possible to manufacture a top-gate thin film semiconductor device as illustrated in FIG. 6 (*h*).

As described above, according to the manufacturing method for the top-gate thin film semiconductor device according to the embodiment, the intensity distribution of the CW laser beam for crystallizing the silicon thin film to be the channel layer is configured in the same manner as in the manufacturing method for the bottom-gate thin film semiconductor device such that the integral intensity value S2 of the light intensity distribution on the posterior side (cooling side) of the beam scanning direction is larger than the integral intensity value S1 of the light intensity distribution on the anterior side (heat input side) of the beam scanning direction.

With this, in the same manner as in the manufacturing method for the bottom-gate thin film semiconductor device, it is possible to slow down the cooling speed for the silicon thin film, and thus it is possible to increase the grain size in the silicon thin film, without increasing the laser output energy. Accordingly, without changing the input energy, it is possible to form a channel layer composed of the crystalline silicon thin film with a large crystal grain size, allowing manufacturing of a thin film semiconductor device with good turn-on characteristics.

Note that, in the top-gate thin film semiconductor device, it is preferable that the FWHM W1 of the intensity distribution BP1 of the laser beam in the short-axis direction is between 20 and 50 μm, in the same manner as in the bottom-gate thin film semiconductor device. In addition, in the top-gate thin film semiconductor device, in the silicon thin film crystallizing process, the flat width in the intensity distribution BP2 of the laser beam in the Y-axis direction is equal to or wider than the width of the silicon thin film 13 in a portion of the silicon thin film 13 to be the channel layer (the width of the silicon thin film in a direction orthogonal to the relative scanning direction). In addition, in the top-gate thin film semiconductor device, it is possible to form a crystalline silicon thin film at least with silicon crystal grains having crystal grain size between 30 and 300 nm, and to form a crystalline silicon thin film with all of the silicon crystal grains having a crystal grain size between 30 and 300 nm.

(Manufacturing Method for Thin Film Semiconductor Array Substrate)

Figure 7:
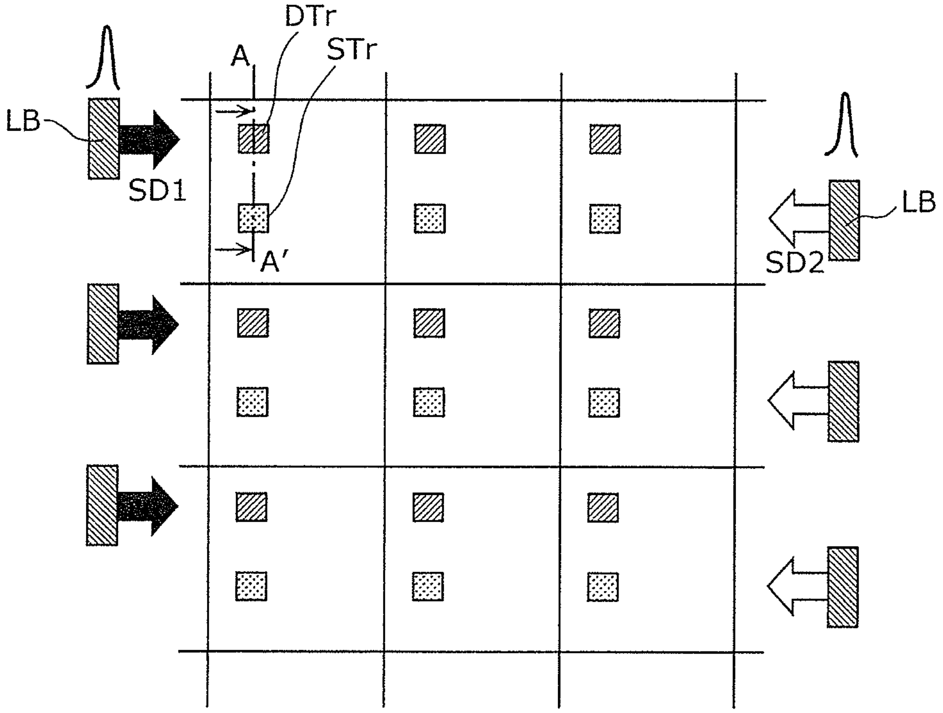
FIG. 7 is a plan view schematically illustrating a thin film semiconductor array substrate according to the embodiment of the present invention.
Figure 8:
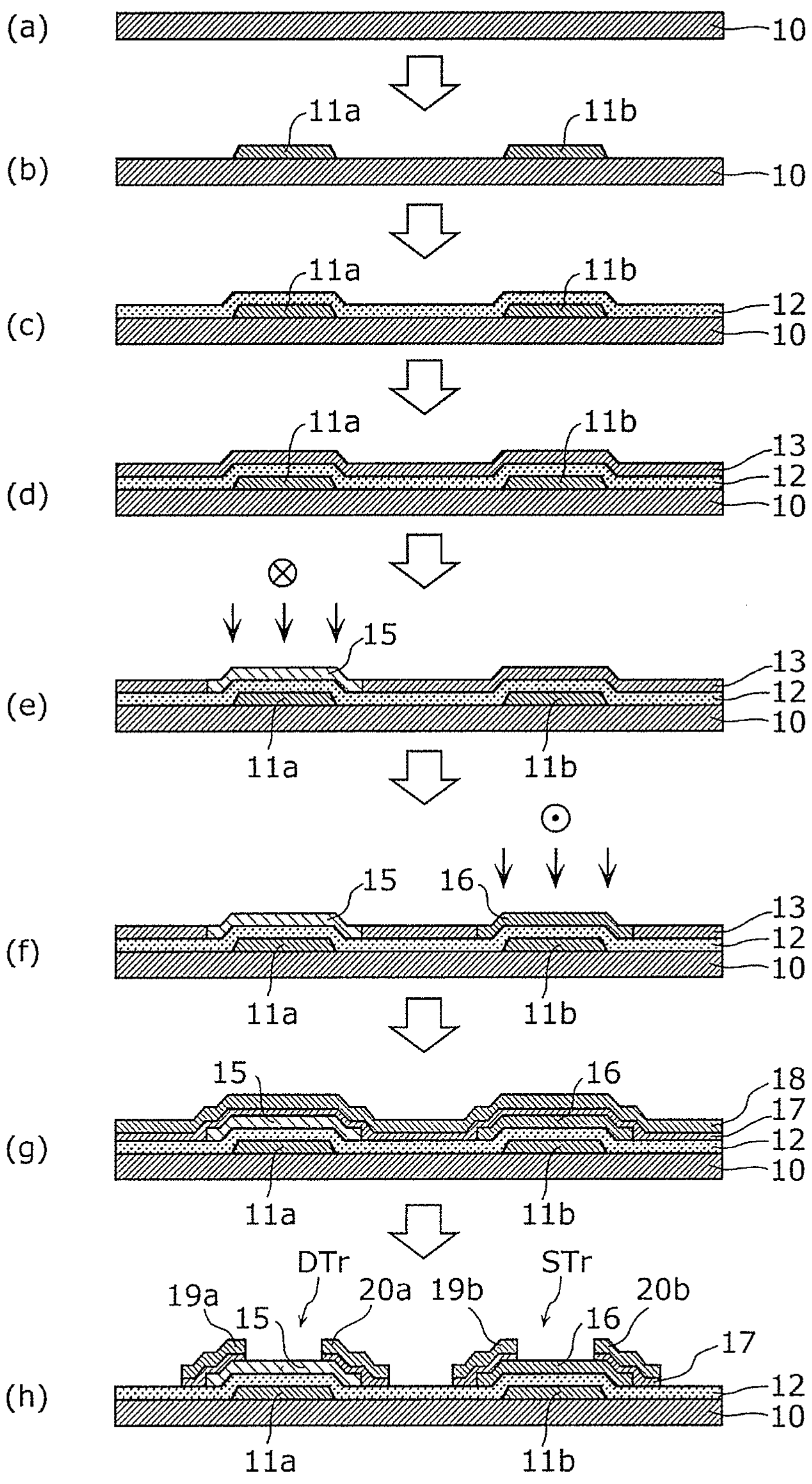
FIG. 8 is cross-sectional views (along A-A' in FIG. 7) of processes in the manufacturing method for the thin film semiconductor array substrate according to the embodiment of the present invention.

The manufacturing method for the thin film semiconductor array substrate according to the embodiment of the present invention shall be described with reference to FIGS. 7 and 8. FIG. 7 is a plan view schematically illustrating the thin film semiconductor array substrate according to the embodiment of the present invention. FIG. 8 illustrates cross-sectional views of the processes in the manufacturing method for the thin film semiconductor array substrate according to the embodiment of the present invention, and the cross-sectional views are along the line A-A' in FIG. 7. Note that, in the manufacturing method of the thin film semiconductor array substrate, formation of the bottom-gate thin film semiconductor device shall be described. The manufacturing method is also applicable to the top-gate thin film semiconductor device.

As illustrated in FIG. 7, the thin film semiconductor array substrate according to the embodiment of the present invention is a TFT array substrate in which thin film transistors (thin film semiconductor devices) are formed, and includes multiple pixels arranged in a matrix. Each of the pixels are partitioned by the gate line arranged in the row direction and the source line arranged in the column direction, and one pixel (unit pixel) includes a driving transistor DTr and a switching transistor STr. Note that, in the embodiment, the organic EL element is formed on the thin film semiconductor array substrate. The driving transistor DTr is a thin film transistor for driving the organic EL element, and the switching transistor STr serves as a thin film transistor for supplying a video signal from the source line to the pixel.

In the manufacturing method for the thin film semiconductor array substrate according to the embodiment, first, the substrate 10 is prepared as illustrated in FIG. 7 (*a*) (substrate preparation process).A glass substrate may be used as the substrate 10, for example. Note that, as described above, an undercoating film may be formed on the substrate 10.

Next, as illustrated in FIG. 8 (*b*), a first gate electrode 11*a* of the driving transistor DTr and a second gate electrode 11*b* of the switching transistor STr are formed by patterning above the substrate 10 (gate electrode forming process). For example, a gate metal film such as molybdenum-tungsten (MoW) is formed by sputtering on the entire surface above the substrate 10, and photolithography and wet etching are performed on the gate metal film so as to pattern the first gate electrode 11*a* and the second gate electrode 11*b* in the predetermined shape.

Next, as illustrated in FIG. 8 (*c*), the gate insulating film 12 is formed above the substrate 10 (gate insulating film forming process). For example, the gate insulating film 12 composed of an insulating film such as silicon dioxide is firmed on the entire surface above the substrate 10 by plasma CVD, for example, so as to cover the first gate electrode 11*a* and the second gate electrode 11*b*.

Next, as illustrated in FIG. 8 (*d*), the non-crystalline silicon thin film 13 is formed above the substrate 10 (silicon thin film forming process). For example, on the gate insulating film 12, an amorphous silicon film (amorphous silicon thin film) is formed by plasma CVD, for example.

Next, as illustrated in FIG. 8 (*e*), the silicon thin film 13 is crystallized by relatively scanning the silicon thin film 13 with the laser beam so as to irradiate the predetermined region of the silicon thin film corresponding to the channel layer of the driving transistor DTr with the laser beam, so as to form the crystalline silicon thin film (the first crystalline silicon thin film) 15 (first silicon thin film crystallizing process).

More specifically, the silicon thin film 13 is irradiated with the CW laser beam with the light intensity distribution illustrated in FIGS. 2A and 2B in a microsecond order. Furthermore, the laser beam irradiation is performed toward the depth direction of the sheet of FIG. 7. More specifically, among the scanning direction SD1 and the scanning direction SD2 illustrated in FIGS. 2A and 2B, the irradiation is performed with the scanning direction SD1 on the anterior side (heat input side) and with the scanning direction SD2 on the posterior side (cooling side). To put it differently, the relative scanning using the laser beam is performed with the relative scanning direction on the short-axis direction of the intensity distribution of the laser beam, the light intensity distribution composing the integral intensity value S1 being the anterior side of the relative scanning direction, and the light intensity distribution composing the integral intensity value S2 being the posterior side of the relative scanning direction.

In addition, in the embodiment, as illustrated in FIG. 7, the laser beam is irradiated along the row direction from a scanning starting end of the laser beam which is one end of the substrate in the row direction to a scanning end which is the other end of the substrate. With this, the silicon thin film in a part on which the laser beam is irradiated is sequentially heated and crystallized, forming a band-shaped crystalline silicon thin film 15.

Next, as illustrated in FIG. 8 (*f*), with the laser beam, the predetermined region of the silicon thin film 13 corresponding to the channel layer of the switching transistor STr is irradiated, thereby crystallizing the silicon thin film 13 so as to form the crystalline silicon thin film (the second crystalline silicon thin film) 16 (second silicon thin film crystallizing process). In this embodiment, the intensity distribution of the laser beam with respect to the scanning direction is inverted such that the integral intensity value of the intensity distribution of the laser beam on the cooling side of the scanning direction is larger than the integral intensity value of the intensity distribution of the laser beam on the heat input side of the scanning direction.

More specifically, the laser irradiation is performed using the CW laser beam having the light intensity distribution illustrated in FIGS. 2A and 2B. Among the scanning direction SD1 and the scanning direction SD2, the laser beam irradiation is performed with the scanning direction SD2 on the anterior side (heat input side) and the scanning direction SD1 on the posterior side (cooling side) such that the laser scanning is performed toward the forward direction of the sheet of FIG. 8. More specifically, the relative scanning of the laser beam is performed with the relative scanning direction on the short-axis direction of the intensity distribution of the laser beam, the light intensity distribution composing the integral intensity value S2 being the anterior side of the relative scanning direction, and the light intensity distribution composing the integral intensity value S1 being the posterior side of the relative scanning direction.

In this embodiment, as illustrated in FIG. 7, the laser irradiation is performed to the scanning end which is the other end of the substrate in the row direction as described above, and subsequently, another scanning is started with the scanning end as a new scanning starting end, and the laser irradiation is performed along the row direction from the scanning staring end of the laser beam which is the other end of the substrate in the row direction to the scanning end which is the one end of the substrate in the row direction. With this, the silicon thin film on which the laser beam is irradiated is sequentially heated and crystallized, forming a band-shaped crystalline silicon thin film 16.

Subsequently, as illustrated in FIG. 7, the crystalline silicon thin film corresponding to the channel layer for all of the pixels on the substrate is formed by alternately repeating the first silicon thin film crystallizing process and the second thin film crystallizing process in the column direction. Here, the first silicon thin film crystallizing process is a laser scanning from the end of the substrate to the other end of the substrate in the row direction, and the second silicon thin film crystallizing process is a laser scanning from the other end of the substrate to the one end of the substrate in the row direction.

After that, although not illustrated, by performing photolithography and wet etching, the non-crystalline silicon thin film 13 and the crystalline silicon thin films 15 and 16 are selectively patterned, forming the crystalline silicon thin films 15 and 16 in island pattern in each pixel.

Next, as illustrated in FIG. 8 (*g*), the amorphous silicon film is formed by plasma CVD, for example, and impurity such as phosphorous is doped on the amorphous silicon film to form an impurity doped $n^+$ layer is formed to be the contact layer 17. Subsequently, as illustrated in FIG. 8 (*g*), three-layered source/drain metal film 18 made of MoW/Al/MoW, for example, is formed by sputtering on the contact layer 17.

Next, as illustrated in FIG. 8 (*h*), a pair of the first source electrode 19*a* and the first drain electrode 20*a*, and a pair of the second source electrode 19*b* and the second drain electrode 20*b* are formed above the substrate 10 (source/drain electrodes forming process). For example, photolithography and wet etching are performed so as to pattern the source/drain metal film 18 such that the first source electrode 19*a* and the first drain electrode 20*a*, and the second source electrode 19*b* and the second drain electrode 20*b* are formed.

Subsequently, by performing dry etching with the resist for patterning the source/drain metal film 18 remaining, the contact layer 17 is separated, and a pair of opposing contact layers 17 is formed. With this, the thin film semiconductor array substrate according to the embodiment of the present invention including the driving transistor DTr and the switching transistor STr are manufactured.

According to the manufacturing method for the thin film semiconductor array substrate according to the embodiment, the intensity distribution of the CW laser beam when crystallizing the silicon thin film to be the channel layer of the driving transistor DTr is configured such that the integral intensity distribution value S2 of the light intensity distribution on the posterior side of the beam scanning direction (cooling side) is larger than the integral intensity value S1 of the light intensity distribution in the anterior side of the beam scanning direction (heat input side). More specifically, the intensity distribution is asymmetrical on the heat input side and the cooling side, and has an expanded bottom on the cooling side.

On the other hand, the intensity distribution of the CW laser beam when crystallizing the silicon thin film to be the channel layer of the switching transistor STr has the same light intensity distribution as the CW laser beam when crystallizing the silicon thin film in the driving transistor DTr. The beam scanning direction is inverted such that the integral intensity value S2 of the light intensity distribution on the anterior side of the beam scanning direction (heat input side) is greater than the integral intensity value S1 in the posterior side of the beam scanning direction (cooling side). More specifically, the intensity distribution is configured such that the heat input side has an expanded bottom.

As described above, according to the embodiment, the silicon thin film corresponding to the driving transistor DTr is scanned with the laser beam in the direction of the scanning direction SD1 as illustrated in FIGS. 2A and 2B, and the silicon thin film corresponding to the switching transistor STr is scanned with the laser beam in the direction of the scanning direction SD2 as illustrated in FIGS. 2A and 2B. With this, it is possible to slow down the cooling speed for the silicon thin film corresponding to the driving transistor DTr, increasing the crystal grain size of the crystalline silicon thin film 15. On the other hand, the cooling speed for the silicon thin film corresponding to the switching transistor STr is not slowed down. Thus, it is possible to make the crystal grain size of the crystalline silicon thin film 16 smaller than the crystalline silicon thin film 15.

According to the manufacturing method for the thin film semiconductor array substrate according to the embodiment described above, using different scanning directions of the CW laser beam with the intensity distribution illustrated in FIGS. 2A and 2B, it is possible to easily form the crystalline silicon thin films with different crystal states (crystal grain sizes) without changing the output waveform of the laser. Therefore, the thin film semiconductor array substrate including thin film semiconductor devices with different TFT characteristics can be easily manufactured.

In addition, in the manufacturing method for the thin film semiconductor array substrate according to the embodiment, the beam scanning direction may be inverted using the crystalline silicon thin film forming apparatus 100 illustrated in FIG. 3. In this case, although not illustrated, the crystalline silicon thin film forming apparatus 100 includes a laser beam inversion mechanism for inverting the beam scanning direction such that the intensity distribution of the laser beam with respect to the silicon thin film is inverted.

For example, the optical system unit 130 illustrated in FIG. 3 may include the laser beam inversion mechanism. In this case, the optical system unit 130 is configured to output non-inverted or inverted laser beam, and the intensity distribution of the laser beam can be inverted by outputting non-inverted or inverted laser beam by the optical system unit 130.

Alternatively, the substrate holding unit 110 illustrated in FIG. 3 may include the laser beam inversion mechanism. In this case, a driving mechanism capable of changing the orientation by 180 degrees is included in the substrate holding unit 110, and the intensity distribution of the laser beam may be inverted by rotating the substrate holding unit 110 by 180 degrees.

As such, the first and second thin film transistors in a case in which the crystalline silicon thin films are formed by inverting the scanning directions of the laser beam using the CW laser beam having the intensity distribution illustrated in FIGS. 2A and 2B are manufactured. The first and second thin film transistors shall be described. Here, the first thin film transistor includes the crystalline silicon thin film 15 crystallized by scanning with the laser beam in the scanning direction SD1 with the expanded bottom (the integral intensity value S2) on the cooling side in FIGS. 2A and 2B. The second thin film transistor includes the crystalline silicon thin film 16 crystallized by scanning with the laser beam in the scanning direction SD2 with the expanded bottom on the heat input side. In other words, the first thin film transistor and the second thin film transistor correspond to the driving transistor DTr and the switching transistor STr, respectively.

Figure 9:
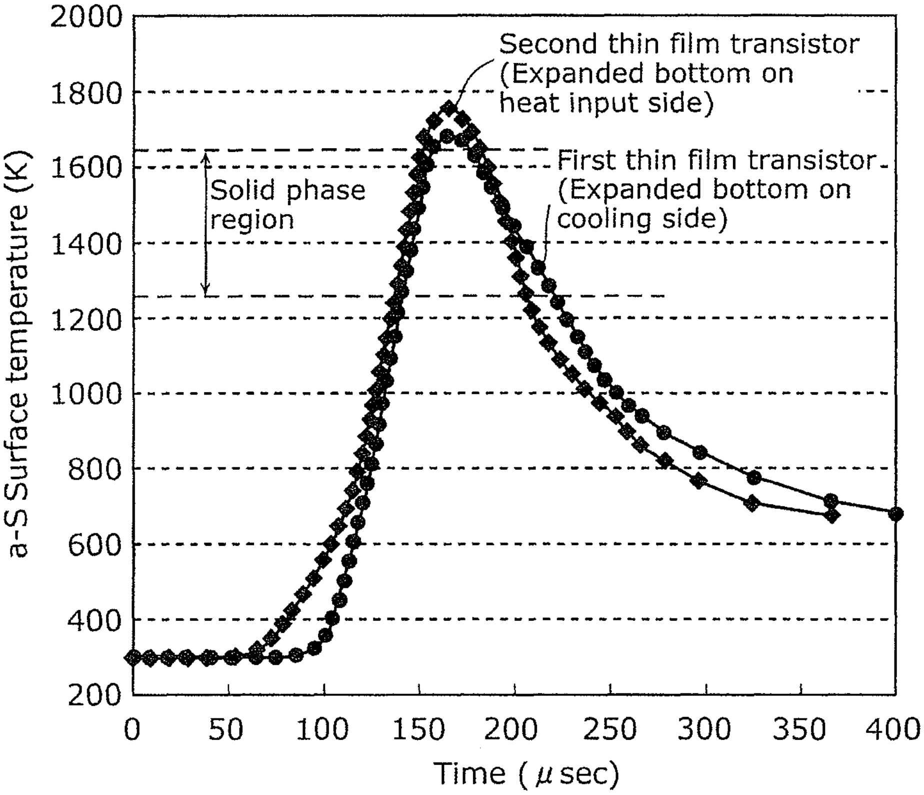
FIG. 9 illustrates a relationship between a surface temperature of a non-crystalline silicon thin film and time in the first thin film transistor (scanning direction SD1) and the second thin film transistor (scanning direction SD2)

First, the relationship between surface temperature and time when crystallizing non-crystalline silicon thin films in the first thin film transistor and the second thin film transistor shall be described with reference to FIG. 9. FIG. 9 illustrates the relationship between surface temperature and time of the non-crystalline silicon thin film in the first thin film transistor (scanning direction SD1) and the second thin film transistor (scanning direction SD2).

As illustrated in FIG. 9, the first thin film transistor with the crystalline silicon thin film crystallized by the scanning with the laser beam having the expanded bottom on the cooling side can slow down the cooling speed, compared to the second thin film transistor with the crystalline silicon thin film crystallized by the scanning with the laser beam in the opposite direction. It is assumed that this makes the crystal grain size of the crystalline silicon thin film for the first thin film transistor greater than the crystal grain size of the crystalline silicon thin film for the second thin film transistor.

Figure 10A:
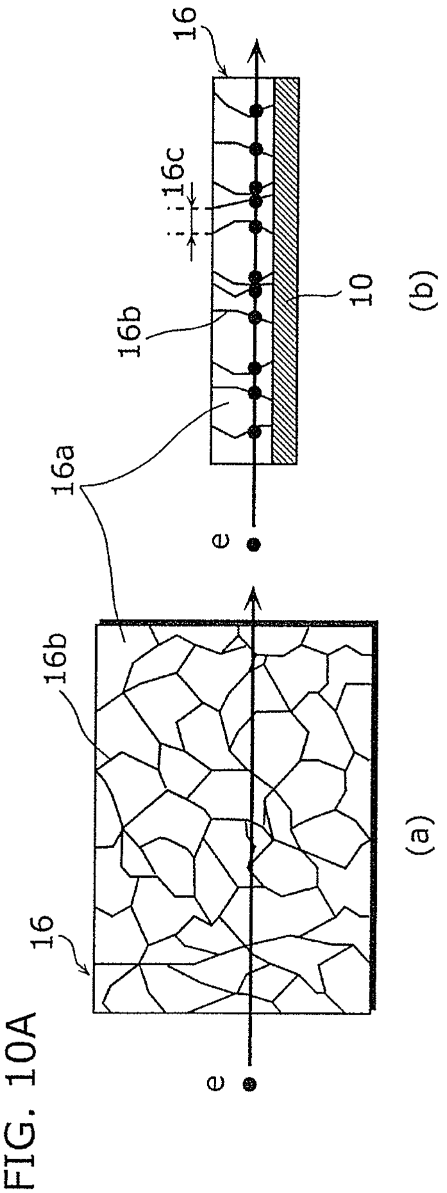
FIG. 10A includes a plan view (a) and a cross-sectional view (b) illustrating the condition of crystals in the crystalline silicon thin film in the second thin film transistor (scanning direction SD2)
Figure 10B:
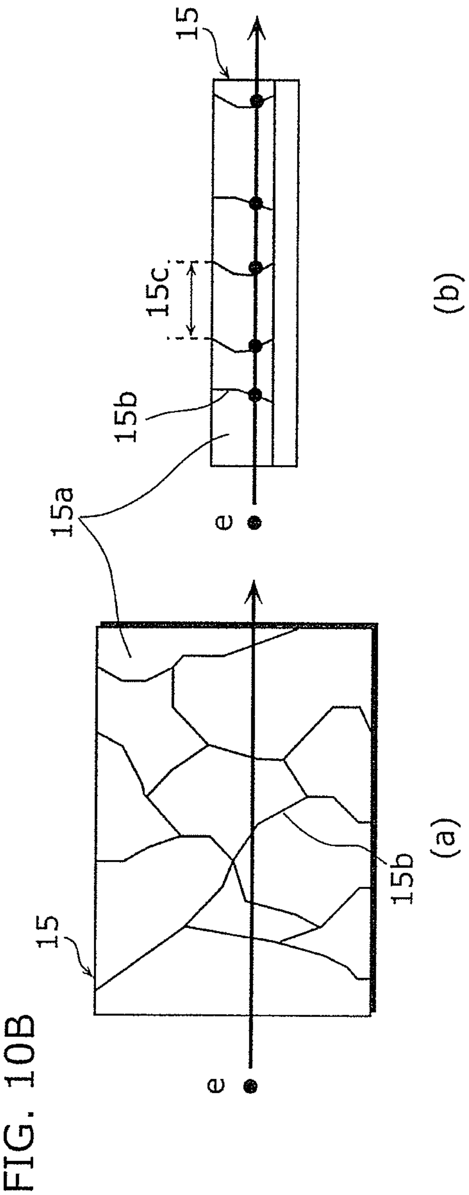
FIG. 10B includes a plan view (a) and a cross-sectional view (b) illustrating the condition of crystals in the crystalline silicon thin film in the first thin film transistor (scanning direction SD1)

The crystal states of the crystalline silicon thin films in the first thin film transistor and the second thin film transistor shall be described with reference to FIGS. 10A and 10B. FIG. 10A includes a plan view (a) and a cross-sectional view (b) illustrating the crystal state of the crystalline silicon thin film in the second thin film transistor (the scanning direction SD2). FIG. 10B includes a plan view (a) and a cross-sectional view (b) illustrating the crystal state of the crystalline silicon thin film in the first thin film transistor (the scanning direction SD1).

As illustrated in FIG. 10A, the crystalline silicon thin film 16 in the second thin film transistor is formed with a plurality of crystal grains (crystal particles) 16*a* with a crystal grain size 16*c*, and the boundary of the crystal grains 16*a* forms a crystal grain boundary 16*b*. In the same manner, as illustrated in FIG. 10B, the crystalline silicon thin film 15 in the first thin film transistor is formed with multiple crystal grains (crystal particles) 15*a* with a crystal grain size 15*c*, and the boundary of the crystal grains 15*a* forms a crystal grain boundary 15*b*.

Here, when the electron (e) passes multiple crystal grains 15*a* (16*a*), the electron passes through the crystal grain boundaries 15*b* (16*b*), and the number of crystal grain boundaries 15*b* (16*b*) is in proportion to the number of crystal grains 15*a* (16*a*). Since the grain boundary 15*b* (16*b*) is a crystal defect, the electron (e) tends to be trapped at the grain boundary 15*b* (16*b*). Accordingly, the larger the crystal grain size 15*c* (16*c*) becomes, the smaller the number of the crystal grain boundaries 15*b* (16*b*) becomes, decreasing the probability of the electron (e) trapped and increasing the mobility of the electron (e).

Here, the mechanism of the crystal growth of the amorphous silicon film is as follows: first, a crystal nucleus is formed, and the crystal grows from the crystal nucleus. More specifically, in the solid-phase growth of the silicon thin film, the crystal nuclei are formed in the amorphous silicon film as the activation energy (free energy) increases, and crystals grow from the crystal nuclei. Here, the crystal grain size g may be represented by the following equation using the activation energy En for generating the crystal nuclei of silicon and the activation energy Eg of the crystal growth speed. Note that, k denotes the Boltzmann coefficient, and T denotes absolute temperature.

$$g \propto \exp[(En-Eg)/3kT]$$

Accordingly, the crystal grain size g increases and the thermal processing time significantly increases as the thermal processing temperature is decreased, and thus, it is assumed that the crystal grain size g increases as the thermal processing time increases. Therefore, it is possible to increase the crystal grain size g by increasing the cooling time for molten silicon, and with this, the crystal grain boundary is decreased, increasing the mobility of the electron.

Accordingly, as illustrated in FIGS. 10A and 10B, the number of crystal grain boundary is smaller and the crystal grain size is smaller in the crystalline silicon thin film 15 in the second thin film transistor than in the crystalline silicon thin film 16 in the first thin film transistor. Thus, as illustrated in FIG. 10A, the mobility of the electron (e) is larger in the case where the electron (e) moves in the crystalline silicon thin film 15 in the second thin film transistor as illustrated in FIG. 10B than in the case where the electron (e) moves in the crystalline silicon thin film 16 in the first thin film transistor as illustrated in FIG. 10A.

The electron mobility of the first thin film transistor and the second thin film transistor that are actually manufactured is measured. The mobility μ of the first thin film transistor is 28.7 ($cm^2$/V·sec) and the mobility μ of the second thin film transistor is 23.7 ($cm^2$/V·sec). Accordingly, the mobility in the first thin film transistor is larger than the mobility in the second thin film transistor. Note that, the output of the laser beam is 80 (kW/$cm^2$), and the scanning speed of the laser is 380 (mm/s).

Figure 11:
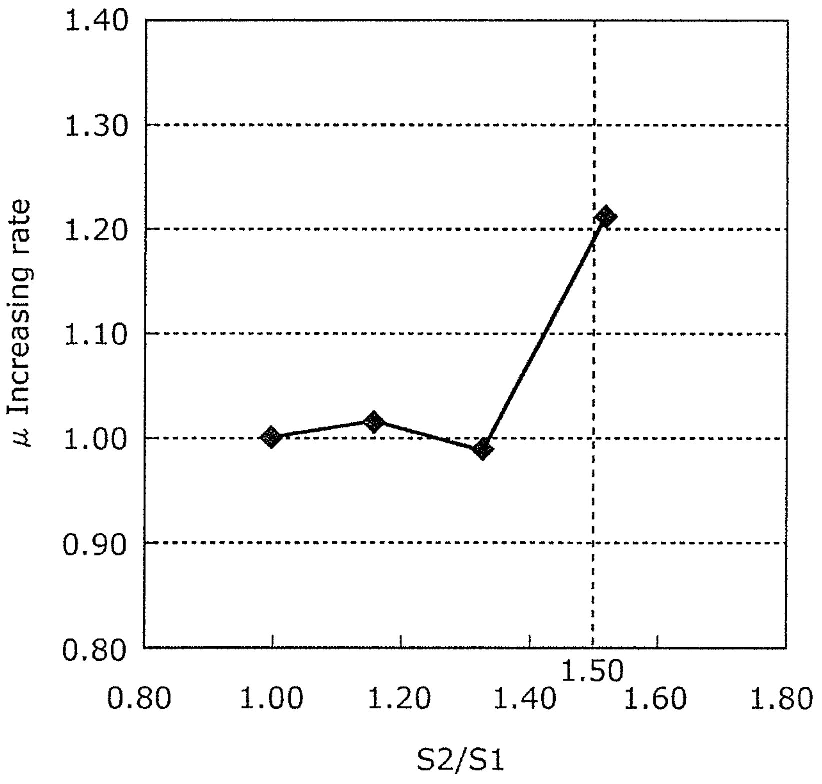
FIG. 11 illustrates a relationship between a ratio of integral intensity values (S2/S1) and a mobility μ of the thin film transistor having the crystalline silicon thin film when the crystalline silicon thin film is formed with varying integral intensity values S1 and S2 in the CW laser beam illustrated in FIGS. 2A and 2B.

Next, the relationship between the integral intensity values S1 and S2 in the CW laser beam illustrated in FIGS. 2A and 2B, and the mobility g of the thin film transistor having the crystalline silicon thin film 15 (scanning direction SD1) shall be described with reference to FIG. 11. FIG. 11 is a graph illustrating a relationship between a ratio of integral intensity values (S2/S1) and the mobility g of the thin film transistor having the crystalline silicon thin film when the crystalline silicon thin film is formed with varying the integral intensity values S1 and S2 in the CW laser beam illustrated in FIGS. 2A and 2B. Note that, in FIG. 11, the mobility μ of the thin film transistor formed using the laser beam having a symmetrical light intensity distribution (integral intensity value S2/S1=1.00) is used as a reference (1.00).

As illustrated in FIG. 11, in order to extend the cooling time when crystallizing the silicon thin film so as to increase the mobility μ, S2/S1>1.50, that is, S2>1.50×S1 is preferable as the relationship between the integral intensity value S1 and the integral intensity value S2. S2>1.50×S1 allows a significant increase in the mobility μ.

Figure 12A:
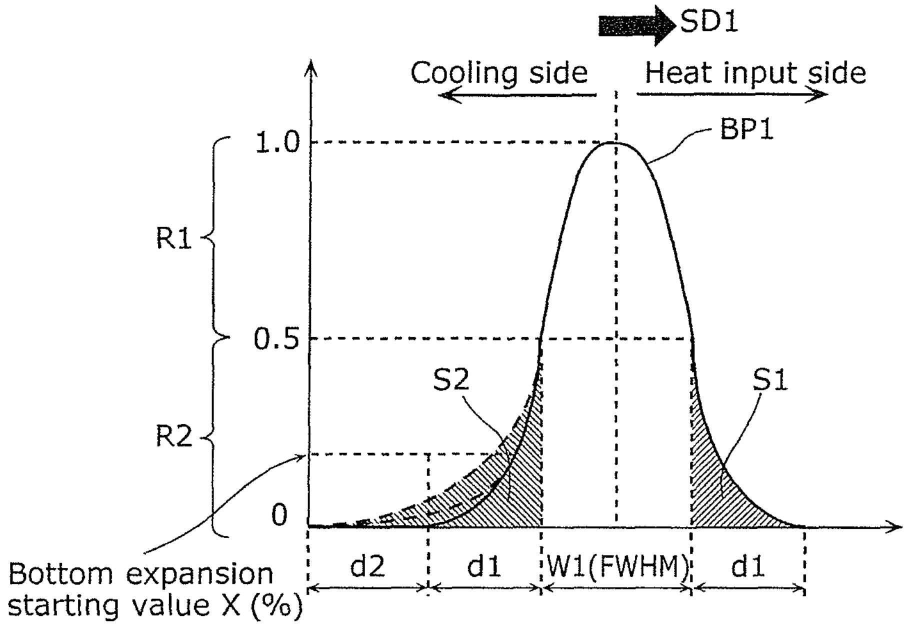
FIG. 12A indicates the intensity distribution BP1 of the laser beam in the short-axis direction.
Figure 12B:
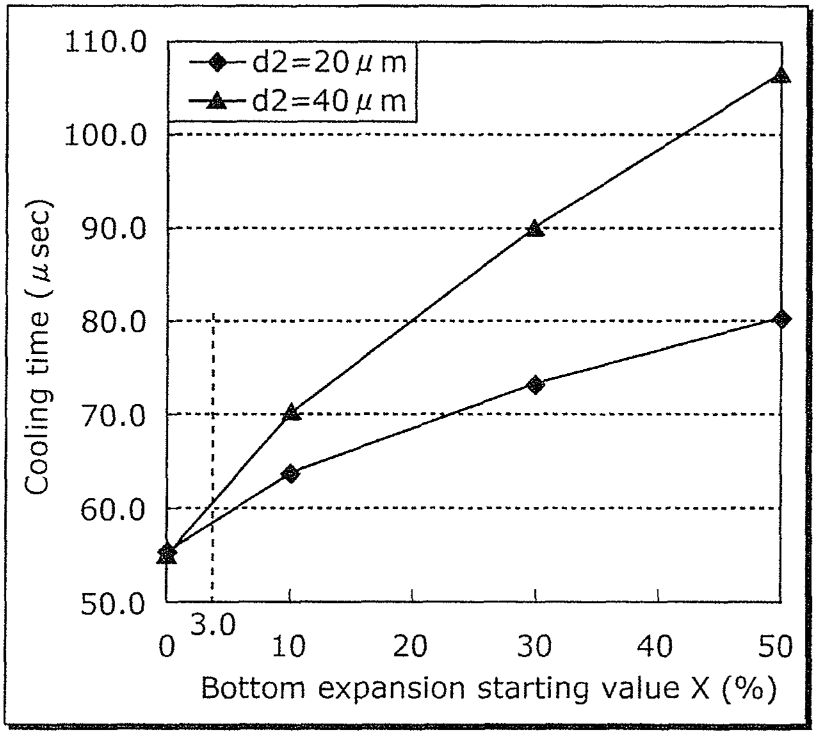
FIG. 12B illustrates a relationship between a bottom-expansion starting value and the cooling time in the intensity distribution BP1 of laser beam in the short-axis direction.

Next, the relationship between the bottom expansion starting value and the cooling time in the region R2 of the CW laser beam illustrated in FIGS. 2A and 2B shall be described with reference to FIGS. 12A and 12B. FIG. 12A illustrates the intensity distribution BP1 of the laser beam in the short-axis direction. More specifically, FIG. 12A indicates a bottom expansion starting value X (%) indicating a starting point of asymmetrical intensity distribution and a difference d2 (μm) of the bottom expansion difference between the heat input side and the cooling side. FIG. 12B illustrates a relationship between the bottom expansion starting value X (%) and the cooling time (sec) in the intensity distribution BP1 of the laser beam in the short-axis direction. Note that, in FIG. 12B, the relationship when d2=20 μm and the relationship when d2=40 μm are separately indicated.

As illustrated in FIG. 12B, the bottom expansion starting value X needs to be 3.0% or higher in order to increase the cooling time for crystallizing the silicon thin film by 10%. In addition, in order to maintain the input energy (energy density) determined by the FWHM W1 at the same level, it is necessary to set the bottom expansion starting value X at 50.0% or lower. Therefore, it is preferable to set the bottom expansion starting value X (%) on the cooling side between 3.0% and 50%.

The manufacturing method for thin film semiconductor device, the manufacturing method for the thin film semiconductor array substrate, the method of forming crystalline silicon thin film, and the apparatus for forming the crystalline silicon thin film according to the present invention have been described based on the embodiment. However, the present invention is not limited to the embodiment described above.

For example, the thin film semiconductor device or the thin film semiconductor array substrate manufactured according to the embodiment may be used for a display apparatus such as an organic EL display apparatus or a liquid crystal display. In addition, the display apparatus may be used as a flat panel display, and may be applicable to an electronic device such as a television set, a personal computer, or a mobile phone.

In addition, the crystalline silicon thin film manufactured based on the embodiment may be used not only for the thin film semiconductor device but also for an electronic device such as a solar cell or a sensor.

Those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The method of forming the crystalline silicon thin film and the apparatus for forming the crystalline silicon thin film are effective for electronic device having crystalline silicon thin films such as thin film transistors, solar cells, or sensors. In addition, the manufacturing method for the thin film semiconductor device and the manufacturing method for the thin film semiconductor array substrate according to the present invention may be widely used for electronic devices such as television sets, personal computers, or mobile phones.

What is claimed is:

1. A manufacturing method for a thin film semiconductor device, comprising:

preparing a substrate;

forming a gate electrode above the substrate;

forming a gate insulating film above the substrate;

forming a source electrode and a drain electrode above the substrate;

forming a silicon thin film above the substrate; and forming a crystalline silicon thin film by irradiating the silicon thin film with a laser beam while scanning the silicon thin film with the laser beam in a scanning direction relative to the silicon thin film so as to crystallize the silicon thin film;

wherein the laser beam is a continuous wave laser beam, an intensity distribution of the laser beam in a first region about a center of the intensity distribution is symmetric on an anterior side and a posterior side of the center relative to the scanning direction with a maximum intensity at the center, the intensity distribution of the laser beam in a second region about the center is asymmetric on the anterior side and the posterior side of the center relative to the scanning direction, the first region being from the maximum intensity of the laser beam to an intensity half of the maximum intensity, the second region being at most equal to the half of the maximum intensity of the laser beam, and in the second region, a second integral intensity value of the intensity distribution of the laser beam on the posterior side of the center relative to the scanning direction is larger than a first integral intensity value of the intensity distribution of the laser beam on the anterior side of the center relative to the scanning direction.

2. The manufacturing method for the thin film semiconductor device according to claim 1, wherein the substrate is prepared and the gate electrode, the gate insulating film, the silicon thin film, the crystalline silicon thin film, and the source electrode and the drain electrode are formed in order, the gate insulating film is formed above the gate electrode, the silicon thin film is formed above the gate electrode and on the gate insulating film, and the source electrode and the drain electrode are formed above the crystalline silicon thin film.

3. The manufacturing method for the thin film semiconductor device according to claim 1, wherein the substrate is prepared and the silicon thin film, the crystalline silicon thin film, the gate insulating film, the gate electrode, and the source electrode and the drain electrode are formed in order, the gate insulating film is formed above the crystalline silicon thin film, the gate electrode is formed above the gate insulating film and above the crystalline silicon thin film between the source electrode and the drain electrode, and the source electrode and the drain electrode are formed above the crystalline silicon thin film.

4. The manufacturing method for the thin film semiconductor device according to claim 1, wherein a full width at half maximum of the intensity distribution of the laser beam is at least approximately 20 μm and at most approximately 50 μm.

5. The manufacturing method for the thin film semiconductor device according to claim 1, wherein the first integral intensity value and the second integral intensity value are calculated within a range from approximately 3% to less than 50% of the maximum intensity of the intensity distribution of the laser beam, in the intensity distribution of the laser beam.

6. The manufacturing method for the thin film semiconductor device according to claim 1, wherein the second integral intensity value is greater than the product of the first integral intensity value and 1.5.

7. The manufacturing method for the thin film semiconductor device according to claim 1, wherein the intensity distribution of the laser beam is formed such that the scanning direction is a short-axis direction of the intensity distribution of the laser beam.

8. The manufacturing method for the thin film semiconductor device according to claim 1, wherein the intensity distribution of the laser beam has a uniform cross-section in a direction orthogonal to the scanning direction.

9. The manufacturing method for the thin film semiconductor device according to claim 8, wherein a flat width of the intensity distribution of the laser beam in a long-axis direction is at least equal to a width of the silicon thin film in a direction orthogonal to the scanning direction.

10. The manufacturing method for the thin film semiconductor device according to claim 1, wherein the crystalline silicon thin film includes a silicon crystal grain with a crystal grain size of at least 30 nm and at most 300 nm inclusive.

11. The manufacturing method for the thin film semiconductor device according to claim 10, wherein the crystalline silicon thin film comprises a plurality of silicon crystal grains each having a crystal grain size of at least 30 nm and at most 300 nm.

12. A manufacturing method for a thin film semiconductor array substrate, comprising:

preparing a substrate;

forming a gate electrode above the substrate;

forming a gate insulating film above the substrate;

forming a source electrode and a drain electrode above the substrate;

forming a silicon thin film above the substrate; and forming a crystalline silicon thin film by irradiating the silicon thin film with a laser beam while scanning the silicon thin film with the laser beam in a scanning direction relative to the silicon thin film so as to crystallize the silicon thin film, wherein the laser beam is a continuous wave laser beam, an intensity distribution of the laser beam in a first region about a center of the intensity distribution is symmetric on a first side and a second side of the center relative to the scanning direction with a maximum intensity at the center, the intensity distribution of the laser beam in a second region about the center is asymmetric on the first side and the second side of the center relative to the scanning direction, the first region being from the maximum intensity of the laser beam to an intensity half of the maximum intensity, the second region being at most equal to the half of the maximum intensity of the laser beam, in the second region, a second integral intensity value of the intensity distribution of the laser beam on the second side of the center relative to the scanning direction is larger than a first integral intensity value of the intensity distribution of the laser beam on the first side of the center relative to the scanning direction, and the scanning is performed such that the first side is an anterior side of the center relative to the scanning direction, and such that the second side is an anterior side of the relative scanning direction by inverting the intensity distribution of the laser beam.

13. The manufacturing method for the thin film semiconductor array substrate according to claim 12, wherein the substrate is prepared and the gate electrode, the gate insulating film, the silicon thin film, the crystalline silicon thin film, and the source electrode and the drain electrode are formed in order, the gate insulating film is formed above the gate electrode, the silicon thin film is formed above the gate electrode and on the gate insulating film, and the source electrode and the drain electrode are formed above the crystalline silicon thin film.

14. The manufacturing method for the thin film semiconductor array substrate according to claim 12, wherein the substrate is prepared and the silicon thin film, the crystalline silicon thin film, the gate insulating film, the gate electrode, and the source electrode and the drain electrode are formed in order, the gate insulating film is formed above the crystalline silicon thin film, the gate electrode is formed above the gate insulating film and above the crystalline silicon thin film between the source electrode and the drain electrode, and the source electrode and the drain electrode are formed above the crystalline silicon thin film.

15. The manufacturing method for the thin film semiconductor array substrate according to claim 12, wherein a full width at half maximum of the intensity distribution of the laser beam is at least approximately 20 μm and at most approximately 50 μm.

16. The manufacturing method for the thin film semiconductor array substrate according to claim 12, wherein the second integral intensity value is greater than the product of the first integral intensity value and 1.5.

17. A manufacturing method for a crystalline silicon thin film, comprising:

preparing a substrate;

forming a silicon thin film above the substrate; and forming a crystalline silicon thin film by irradiating the silicon thin film with a laser beam while scanning the silicon thin film with the laser beam in a scanning direction relative to the silicon thin film so as to crystallize the silicon thin film, wherein the laser beam is a continuous wave laser beam, an intensity distribution of the laser beam in a first region about a center of the intensity distribution is symmetric on an anterior side and a posterior side of the center relative to the scanning direction with a maximum intensity at the center, the intensity distribution of the laser beam in a second region about the center is asymmetric on the anterior side and the posterior side of the center relative to the scanning direction, the first region being from the maximum intensity of the laser beam to an intensity half of the maximum intensity, the second region being at most equal to the half of the maximum intensity of the laser beam, and in the second region, a second integral intensity value of the intensity distribution of the laser beam on the posterior side of the center relative to the scanning direction is larger than a first integral intensity value of the intensity distribution of the laser beam on the anterior side of the center relative to the scanning direction.

* * * * *